(12) United States Patent
Ueno et al.

(10) Patent No.: US 8,860,009 B2
(45) Date of Patent: *Oct. 14, 2014

(54) DEVICE COMPRISING POSITIVE HOLE INJECTION TRANSPORT LAYER, METHOD FOR PRODUCING THE SAME AND INK FOR FORMING POSITIVE HOLE INJECTION TRANSPORT LAYER

(75) Inventors: Shigehiro Ueno, Tokyo-to (JP); Masato Okada, Tokyo-to (JP); Keisuke Hashimoto, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 807 days.

This patent is subject to a terminal disclaimer.

(21) Appl. No.: 12/989,729

(22) PCT Filed: Apr. 28, 2009

(86) PCT No.: PCT/JP2009/058399
§ 371 (c)(1),
(2), (4) Date: Oct. 26, 2010

(87) PCT Pub. No.: WO2009/133903
PCT Pub. Date: Nov. 5, 2009

(65) Prior Publication Data
US 2011/0037065 A1 Feb. 17, 2011

(30) Foreign Application Priority Data
Apr. 28, 2008 (JP) .................. 2008-117556

(51) Int. Cl.
*H01L 29/08* (2006.01)
*H01L 35/24* (2006.01)
*H01L 51/00* (2006.01)
*H01L 51/50* (2006.01)

(52) U.S. Cl.
CPC ............. *H01L 51/009* (2013.01); *Y02E 10/549* (2013.01); *Y02E 10/542* (2013.01); *H01L 51/0035* (2013.01); *H01L 51/5088* (2013.01); *H01L 51/0039* (2013.01)
USPC .............................. 257/40; 257/759; 257/763

(58) Field of Classification Search
CPC ............ H01L 51/5048; H01L 51/5088; H01L 51/5056; H01L 51/5092; H01L 51/5072; H01L 29/7869
USPC ........... 257/40, 79, 80, 103, 59, 72, 431, 758, 257/759, 760, 763; 438/22, 46, 42, 24, 104
See application file for complete search history.

(56) References Cited

U.S. PATENT DOCUMENTS

| 6,111,274 A | 8/2000 | Arai |
| 2005/0142383 A1 | 6/2005 | Igarashi et al. |

(Continued)

FOREIGN PATENT DOCUMENTS

| JP | 09-063771 A | 3/1997 |
| JP | 11-283750 A | 10/1999 |

(Continued)

OTHER PUBLICATIONS

USPTO NFOA dated Mar. 14, 2013 in connection with U.S. Appl. No. 13/459,700.

(Continued)

Primary Examiner — Thanh Y Tran
(74) Attorney, Agent, or Firm — Ladas & Parry LLP

(57) ABSTRACT

A device having an easy production process and capable of achieving a long lifetime. The device has a substrate, two or more electrodes facing each other disposed on the substrate and a positive hole injection transport layer disposed between two electrodes among the two or more electrodes. The positive hole injection transport layer contains a reaction product of a molybdenum complex or tungsten complex.

9 Claims, 4 Drawing Sheets

(56) References Cited

U.S. PATENT DOCUMENTS

| | | |
|---|---|---|
| 2006/0292394 A1 | 12/2006 | Iwaki et al. |
| 2007/0241665 A1 | 10/2007 | Sakanoue et al. |
| 2009/0220705 A1* | 9/2009 | Mizuno et al. ............... 427/555 |
| 2009/0284135 A1* | 11/2009 | Yoshida et al. ............... 313/504 |
| 2010/0237322 A1 | 9/2010 | Okada et al. |
| 2011/0163327 A1* | 7/2011 | Ueno et al. ..................... 257/79 |
| 2012/0119201 A1 | 5/2012 | Ueno et al. |
| 2012/0138916 A1 | 6/2012 | Ueno et al. |
| 2012/0146010 A1 | 6/2012 | Ueno et al. |

FOREIGN PATENT DOCUMENTS

| | | |
|---|---|---|
| JP | 2000-036390 A | 2/2000 |
| JP | 2002-151257 A | 5/2002 |
| JP | 2002-204012 A | 7/2002 |
| JP | 2002-305078 A | 10/2002 |
| JP | 2003-031366 A | 1/2003 |
| JP | 2005-206925 A | 8/2005 |
| JP | 2006-024791 A | 1/2006 |
| JP | 2006-036889 A | 2/2006 |
| JP | 2006-114521 A | 4/2006 |
| JP | 2006-144002 A | 6/2006 |
| JP | 2006-155978 A | 6/2006 |
| JP | 2006-190995 A | 7/2006 |
| JP | 2007-150226 A | 6/2007 |
| JP | 2007-287586 A | 11/2007 |
| JP | 2008-041894 A | 2/2008 |
| JP | 2008-047890 A | 2/2008 |
| JP | 2008-251626 A | 10/2008 |
| WO | 2006/101018 A1 | 9/2006 |

OTHER PUBLICATIONS

European Search Report dated Jan. 25, 2012; Appln. No. EP 09 73 8840.

Tsunenori Suzuki, et al; "69.3: Polymer/Metal-Oxide Composite: A Novel Buffer Layer for Solution-Processible OLEDs" SID 07 Digest; pp. 1840-1842.

International Search Report: PCT/JP2009/058399.

USPTO NFOA dated Oct. 3, 2013 in connection with U.S. Appl. No. 12/989,732.

USPTO NOA mailed Nov. 1, 2013 in connection with U.S. Appl. No. 13/459,700.

* cited by examiner

DEVICE COMPRISING POSITIVE HOLE INJECTION TRANSPORT LAYER, METHOD FOR PRODUCING THE SAME AND INK FOR FORMING POSITIVE HOLE INJECTION TRANSPORT LAYER

TECHNICAL FIELD

The present invention relates to a device comprising a positive hole injection transport layer including an organic device such as an organic electroluminescent element, and a quantum dot light emitting element, a method for producing the same, and an ink for forming the positive hole injection transport layer.

BACKGROUND ART

It is expected that a device using an organic substance develops to a wide range of elementary elements such as an organic electroluminescent element (hereinafter referred to as an organic EL element), an organic transistor, an organic solar battery, and an organic semiconductor and uses. In addition to the above devices, devices having a positive hole injection transport layer include a quantum dot light emitting element, an oxide compound solar battery, etc.

An organic EL element is a charge injection type self light emitting device, utilizing the light emission generated at the time of recombining an electron and a positive hole reaching at a light emitting layer. Such an organic EL element has been developed actively since 1987 when T. W. Tang, et al. proved that an element comprising laminated thin films of a fluorescent metal chelate complex and a diamine based molecule emits light of high luminance with a low driving voltage.

The element configuration of the organic EL element comprises a cathode/an organic layer/an anode. The organic layer in an initial organic EL element has a two layer structure comprising a light emitting layer and a positive hole injection layer. At present, however, in order to obtain a high light emitting efficiency and a long driving lifetime, various multilayered structures such as a five layer structure comprising an electron injection layer/an electron transport layer/a light emitting layer/a positive hole transport layer/a positive hole injection layer, etc. have been proposed.

It is said that the layers other than the light emitting layer including the electron injection layer, the electron transport layer, the positive hole transport layer and the positive hole injection layer have effects that charges are easily injected and transported to the light emitting layer, the balance between an electronic current and a positive hole current is maintained by blocking charges, and the diffusion of a light energy exciton is prevented.

For the purpose of improving charge transport ability and charge injection ability, there has been attempts to increase electric conductivity by mixing an oxidizing compound to a positive hole transport material (Patent Literatures 1 and 2).

In Patent Literature 1, as the oxidizing compound, that is, an electron accepting compound, a compound containing counter anions such as a triphenylamine derivative and antimony hexafluoride, and a compound having a significantly-high electron-accepting property, in which a cyano group is bonded to carbon of a carbon-carbon double bond, such as 7,7,8,8-tetracyanoquinodimethane, are used.

In Patent Literature 2, as an oxidizing dopant, a general oxidant can be exemplified, and also halogenated metal, Lewis acid, organic acid and salt of arylamine and halogenated metal or Lewis acid can be exemplified.

In Patent Literatures 3 to 6, as the oxidizing compound, that is, the electron accepting compound, a metal oxide being a compound semiconductor is used. For the purpose of obtaining a positive hole injection layer having an excellent injection property and charge transfer property, for example, a thin film is formed by a vapor deposition method using a metal oxide such as vanadium pentoxide or molybdic trioxide, or a mixed film is formed by codeposition of a molybdenum oxide and an amine based low molecular weight compound.

In Patent Literature 7, a solution, in which oxovanadium (V) tri-i-propoxideoxide is dissolved as the oxidizing compound, that is, the electron accepting compound, is used. Patent Literature 7 discloses a method for forming a charge transfer complex comprising the step of forming a mixed coating film of the solution and a positive hole transport polymer followed by hydrolysis in water vapor to obtain vanadium oxide.

Patent Literature 8 discloses that an organic EL element having a long lifetime is produced by dispersing particles produced by physically pulverizing molybdic trioxide in a solution to produce a slurry, and applying the slurry to form a positive hole injection layer, as an attempt to form a coating film of molybdic trioxide.

On the other hand, an organic transistor is a thin film transistor using an organic semiconductor material comprising an organic polymer or an organic low-molecular compound having a π conjugated system for a channel area. A general organic transistor comprises a substrate, a gate electrode, a gate insulating layer, source and drain electrodes and an organic semiconductor layer. In the organic transistor, by changing a voltage (gate voltage) applied to the gate electrode, a quantity of electric charge of an interface of a gate insulating layer and an organic semiconductor layer is controlled and switching is performed by changing a current value between a source electrode and a drain electrode.

As an attempt to improve an on-current value of the organic transistor and stabilize element characteristic by lowering a charge injection barrier between the organic semiconductor layer and the source electrode or the drain electrode, it is known that the carrier density in the organic semiconductor layer in the vicinity of the electrode is increased by introducing the charge transfer complex to an organic semiconductor (for example, Patent Literature 9).

CITATION LIST

Patent Literature

[Patent Literature 1] Japanese Patent Application Laid-Open (JP-A) No. 2000-36390
[Patent Literature 2] Japanese patent No. 3748491
[Patent Literature 3] JP-A No. 2006-155978
[Patent Literature 4] JP-A No. 2007-287586
[Patent Literature 5] Japanese patent No. 3748110
[Patent Literature 6] Japanese patent No. 2824411
[Patent Literature 7] SID 07 DIGEST p. 1,840 to 1,843 (2007)
[Patent Literature 8] JP-A No. 2008-041894
[Patent Literature 9] JP-A No. 2002-204012

SUMMARY OF INVENTION

Technical Problem

However, even if any of oxidizing materials as disclosed in Patent Literatures 1 to 9 is used as a positive hole transport material, an element having a long lifetime is hardly realized, or the lifetime needs to be further extended. The reason thereof is presumed that oxidizing materials disclosed in Patent Literatures 1, 2, and 9 have a low oxidizing ability toward the positive hole transport material, or low dispersing stability in a thin film. For example, in the case that an oxidizing material comprising a cationic triphenylamine derivative and antimony hexafluoride used in both Patent Literature 1 and Patent Literature 2 is mixed with the positive hole transport material, a charge transfer complex is produced, while the same number of free antimony hexafluoride being a counter anion type as the charge transfer complex is present in a thin film. It is assumed that the free antimony hexafluoride migrates upon driving so that materials partially aggregate and precipitate at the interface with an adjacent layer, thus, the dispersing stability of the material in the thin film upon driving decreases. It is considered that such a change of dispersing stability upon driving changes a carrier injection or transport in the element, therefore, it has an adverse effect on lifetime property. In addition, it is considered that metal oxides disclosed in Patent Literatures 3 to 5 improve positive hole injection property, however, it makes the adhesion of the interface to an adjacent organic compound layer insufficient, thus, the metal oxide has an adverse effect on lifetime property.

In addition, there is a problem that the oxidizing materials as disclosed in Patent Literatures 1 to 9 lack versatility since it has insufficient solvent solubility of dissolving at the same time as a positive hole transport polymer compound used to form a film by a solution applying method so that only the oxidizing materials aggregate, and the types of usable solvents are limited. Particularly for a molybdenum oxide being an inorganic compound, there is a problem that although it has a relatively-high property, it is insoluble in a solvent, therefore, the solution applying method cannot be used. For example, Patent Literature 7 discloses a method for forming a charge transfer complex as a vanadium oxide by forming a mixed coating film of an oxovanadium(V) tri-i-propoxide oxide and a positive hole transport polymer followed by hydrolysis in water vapor. However, in Patent Literature 7, the oxovanadium(V) tri-i-propoxide oxide solidifies by a hydrolytic polycondensation reaction, thus, vanadium easily aggregates and film property is hardly controlled, therefore, an excellent film is hardly obtained. In addition, since a coating film cannot be formed only of the oxovanadium(V) tri-i-propoxide oxide, it is mixed with the positive hole transport polymer, therefore, the organic component concentration of the coating film of Patent Literature 7 is naturally high and the vanadium concentration, which is considered as an active component for a lifetime of an element, is insufficient. As described above, in Patent Literature 7, further improvement in the lifetime property and the element characteristics are required. In addition, Patent Literature 8 discloses that a charge injection layer is produced by a screen printing method using a slurry in which molybdenum oxide particles having an average particle diameter of 20 nm are dispersed in a solvent. However, it is in fact significantly difficult, for example, to produce particles having a uniform particle diameter on a scale of 10 nm or less to satisfy the request for forming a positive hole injection layer having a thickness of about 10 nm by the method of pulverizing $MoO_3$ powder as described in Patent Literature 8. In addition, it is more difficult to stably disperse molybdenum oxide particles produced by pulverization in a solution without aggregation. If the particles are unstably dispersed in a solution, only a film having an unevenness with large difference in height and a poor smoothness can be formed upon forming a coating film, thus, it can cause short circuit of a device. In the case that a thin film can be only formed by a vapor deposition method, there has been a problem of not being able to take advantage of the solution applying method, even if a light emitting layer is formed by coating separately by the solution applying method such as an ink-jet method. That is, to avoid impairing liquid repellency of bulkhead (bank) between the light emitting layers by a molybdenum oxide having lyophilicity, the positive hole injection layer or the positive hole transport layer containing the molybdenum oxide being the inorganic compound is required to be deposited using a very fine mask, and it cannot take advantage of the solution applying method from the viewpoint of cost and yield. Further, the molybdenum oxide being the inorganic compound is an oxygen defect type oxide semiconductor, and as for the electric conductivity, $Mo_2O_5$ having an oxidation number of +5 is a better conductor than $MoO_3$ having an oxidation number of +6 at ordinary temperature, however, it is unstable in the air. Therefore, the compound which can be easily deposited by heating is limited to an oxidized compound having a stable valence such as $MoO_3$ or $MoO_2$.

The film-forming property and the stability of the thin film strongly influence the lifetime property of an element. Generally, the lifetime of an organic EL element is defined as the time in which luminance decreases by half when continuous driving at a constant current, and the longer the time in which luminance decreases by half of the element is, the longer the driving lifetime of the element is.

The present invention has been achieved in view of the above problems. A main object of the present invention is to provide a device capable of forming a positive hole injection transport layer by a solution applying method, thus having an easy production process, and capable of achieving a long lifetime.

Solution to Problem

As a result of diligent researches, the inventors of the present invention has found out that by using a molybdenum complex or tungsten complex for a positive hole injection transport layer to produce a reaction product of the molybdenum complex or a reaction product of the tungsten complex, the positive hole injection transport layer becomes a film having a high stability, which is capable of forming a charge transfer complex, thus improving positive hole injection property, and has an excellent adhesion to an adjacent electrode or organic layer, and the inventors has reached the present invention.

That is, a device of the present invention is a device comprising a substrate, two or more electrodes facing each other disposed on the substrate and a positive hole injection transport layer disposed between two electrodes among the two or more electrodes, wherein the positive hole injection transport layer contains a reaction product of a molybdenum complex or tungsten complex.

Unlike a molybdenum oxide or tungsten oxide being an inorganic compound, the reaction product of the molybdenum complex or tungsten complex used for the device of the present invention can control charge injection property and charge transport property by the valence of the metal and a ligand. In addition, unlike the molybdenum oxide or tungsten oxide being the inorganic compound, the molybdenum complex or tungsten complex can contain an organic part in the ligand, thus, the compatibility with a positive hole transport compound being an organic substance, and the adhesion of an interface to an adjacent organic layer become excellent. Furthermore, it can be considered that the molybdenum complex or tungsten complex has higher reactivity than a metal complex which has been conventionally used such as copper phthalocyanine, thus, the reaction product of the molybdenum complex or tungsten complex easily forms a charge transfer complex. Therefore, the device of the present invention comprising the positive hole injection transport layer containing the reaction product of the molybdenum complex or tungsten complex can achieve a low voltage driving, a high power efficiency, and a long lifetime.

In addition, by selecting a type of ligand of the molybdenum complex or tungsten complex or modifying the ligand, it is easy to multifunctionalize the device of the present invention, including imparting functionalities such as solvent solubility, hydrophilicity/hydrophobicity, charge transport property, and adhesion.

The molybdenum complex or tungsten complex used for the positive hole injection transport layer of the device of the present invention can be easily synthesized with a small number of synthesizing steps by being appropriately selected, therefore, a device having a high efficiency can be produced at a low cost.

Most of the molybdenum complex or tungsten complex used for the device of the present invention has solvent solubility or high compatibility with the positive hole transport compound being used together. In this case, a thin film can be formed by the solution applying method, therefore, there are many advantages of the production process. In such a case of using the solution applying method, the molybdenum complex or tungsten complex is less likely to aggregate similarly as a pigment, for example, and has high stability in the solution, therefore, there is an advantage that the yield is high. In addition, in the case of forming the positive hole injection transport layer by the solution applying method, layers from the positive hole injection transport layer to the light emitting layer can be sequentially formed on a substrate having a liquid-repellent bank only by a coating process. Therefore, the above coating process is more simple and has an advantage of producing the device at lower cost compared with a process as in the case of the molybdenum oxide being the inorganic compound including after depositing the positive hole injection layer by a vapor deposition using a very fine mask or the like, forming the positive hole transport layer and the light emitting layer by the solution applying method, and further depositing a second electrode.

In the device of the present invention, it is preferable that the reaction product of the molybdenum complex or tungsten complex is a composite of molybdenum having an oxidation number of +5 and molybdenum having an oxidation number of +6, or a composite of tungsten having an oxidation number of +5 and tungsten having an oxidation number of +6 respectively from the viewpoint of lowering driving voltage and extending an element lifetime.

In the device of the present invention, it is preferable that the reaction product of the molybdenum complex or tungsten complex is respectively the molybdenum oxide or tungsten oxide produced by a reaction of the molybdenum complex or tungsten complex and an organic solvent having a carbonyl group and/or hydroxyl group from the viewpoint of lowering driving voltage and extending the element lifetime.

In the device of the present invention, it is preferable that the reaction product of the molybdenum complex or tungsten complex is the composite of molybdenum having an oxidation number of +5 and molybdenum having an oxidation number of +6, or the composite of tungsten having an oxidation number of +5 and tungsten having an oxidation number of +6 respectively, and the reaction product of the molybdenum complex or tungsten complex is in an anion state from the viewpoint of lowering driving voltage and extending the element lifetime.

In the device of the present invention, it is preferable that the positive hole injection transport layer contains at least the reaction product of the molybdenum complex or tungsten complex, and the positive hole transport compound from the viewpoint of lowering driving voltage and further extending the element lifetime.

In the device of the present invention, the positive hole injection transport layer may comprise layers in which at least a layer containing the reaction product of the molybdenum complex or tungsten complex, and a layer containing the positive hole transport compound are laminated.

In the device of the present invention, the positive hole injection transport layer may comprise the layers in which at least the layer containing the reaction product of the molybdenum complex or tungsten complex, and the layer at least containing the reaction product of the molybdenum complex or tungsten complex and the positive hole transport compound are laminated.

In the device of the present invention, it is preferable that the positive hole transport compound is a positive hole transport polymer compound, from the viewpoint of lowering driving voltage and further extending the element lifetime.

The device of the present invention is suitably used for an organic EL element containing the organic layer at least having the light emitting layer.

A method for producing the device of the present invention is a method for producing a device comprising a substrate, two or more electrodes facing each other disposed on the substrate and a positive hole injection transport layer disposed between two electrodes among the two or more electrodes comprising: a preparation step of preparing an ink for forming the positive hole injection transport layer containing a molybdenum complex or tungsten complex, and an organic solvent having a carbonyl group and/or hydroxyl group; a formation step of forming the positive hole injection transport layer on any of layers on the electrodes using the ink for forming the positive hole injection transport layer; and an oxidation step of oxidizing at least a part of the molybdenum complex or tungsten complex to produce the molybdenum oxide or tungsten oxide.

According to the method for producing the device of the present invention, it is possible to provide a device capable of forming the positive hole injection transport layer by the solution applying method, thus having an easy production process, and capable of achieving the long lifetime.

In the method for producing the device of the present invention, the oxidation step may be performed after preparing the ink for forming the positive hole injection transport layer before or after forming the positive hole injection transport layer.

That is, one embodiment of the method for producing the device of the present invention comprises: the formation step of forming the positive hole injection transport layer containing the molybdenum complex or tungsten complex on any of the layers on the electrodes; and the oxidation step of oxidizing at least the part of the molybdenum complex or tungsten complex in the positive hole injection transport layer to produce the molybdenum oxide or tungsten oxide.

Another embodiment of the method for producing the device of the present invention comprises the oxidation step being performed after preparing the ink for forming the positive hole injection transport layer before forming the positive hole injection transport layer so that the formation step is forming the positive hole injection transport layer containing the molybdenum oxide or tungsten oxide on any of layers on the electrodes using the oxidized ink for forming the positive hole injection transport layer.

In the method for producing the device of the present invention, it is preferable that the oxidation step is performed in the presence of oxygen.

In the method for producing the device of the present invention, a heating process and/or a light irradiation process and/or a process of using active oxygen can be used as the oxidation step.

The ink for forming the positive hole injection transport layer of the present invention comprises the composite of molybdenum having an oxidation number of +5 and molybdenum having an oxidation number of +6 being the reaction product of the molybdenum complex, or the composite of tungsten having an oxidation number of +5 and tungsten having an oxidation number of +6 being the reaction product of the tungsten complex with the organic solvent containing the carbonyl group and/or hydroxyl group.

In the ink for forming the positive hole injection transport layer of the present invention, it is preferable that the composite of molybdenum having an oxidation number of +5 and molybdenum having an oxidation number of +6 or the composite of tungsten having an oxidation number of +5 and tungsten having an oxidation number of +6 is the reaction product of the molybdenum complex or tungsten complex with the organic solvent having the carbonyl group and/or hydroxyl group, and is the molybdenum oxide or tungsten oxide, from the viewpoint of lowering driving voltage and further extending the element lifetime.

Advantageous Effects of Invention

The device of the present invention is capable of having an easy production process and achieving a long lifetime.

According to the method for producing the device of the present invention, it is possible to provide a device capable of having an easy production process and achieving a long lifetime.

In addition, according to the ink for forming the positive hole injection transport layer of the present invention, it is possible to provide a device capable of having an easy production process and achieving a long lifetime.

REFERENCE SIGNS LIST

Figure 1:
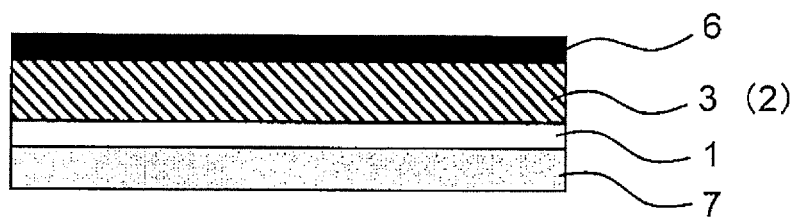
FIG. 1 is a sectional schematic diagram showing a basic constitution of layers of the device of the present invention.

1: electrode
2: positive hole injection transport layer
3: organic layer
4a: positive hole transport layer
4b: positive hole injection layer
5: light emitting layer
6: electrode
7: substrate
8: organic semiconductor layer
9: electrode
10: insulating layer

DESCRIPTION OF EMBODIMENTS

1. Device

A device of the present invention comprises a substrate, two or more electrodes facing each other disposed on the substrate and a positive hole injection transport layer disposed between two electrodes among the two or more electrodes, wherein the positive hole injection transport layer contains a reaction product of a molybdenum complex or a reaction product of a tungsten complex.

The device of the present invention can achieve a long lifetime of an element since the positive hole injection transport layer can be a film having a high stability, which is capable of forming a charge transfer complex, thus improving positive hole injection property, and has an excellent adhesion to an adjacent electrode or organic layer by containing the reaction product of the molybdenum complex or tungsten complex. In addition, the positive hole injection transport layer can be formed using a solution applying method. In this case, it is possible to have an easy production process and achieve the long lifetime.

The reason why the reaction product of the molybdenum complex or tungsten complex used for the device of the present invention can extend the lifetime, as described above, is assumed as below. That is, the molybdenum complex or tungsten complex has high reactivity, and can form the reaction product by the reaction between complexes, for example, through a redox reaction with an organic solvent used when a layer is formed by the solution applying method. It can be assumed that since the reaction product of the molybdenum complex or tungsten complex easily forms a charge transfer complex with the positive hole transport compound or the reaction product of the complex, the charge injection transport ability of the positive hole injection transport layer can be efficiently improved, thus, the lifetime can be extended. In addition, unlike an oxide being an inorganic compound, the reaction product of the complex can control charge injection property and charge transport property by a ligand and the valence of the metal. Accordingly, in the present invention, it is possible to improve the charge injection transport ability of the positive hole injection transporting efficiently. In addition, unlike a molybdenum oxide or tungsten oxide being an inorganic compound, the molybdenum complex or tungsten complex can contain an organic part in the ligand, thus, the compatibility with a positive hole transport compound being an organic substance, and the adhesion of an interface to an adjacent organic layer become excellent. It can be assumed that, therefore, the device of the present invention comprising the positive hole injection transport layer containing the reaction product of the molybdenum complex or tungsten complex can achieve a low voltage driving, a high power efficiency, and a particularly long lifetime.

In addition, in the device of the present invention, by selecting a type of ligand of the molybdenum complex or tungsten complex or modifying the ligand, it is easy to multifunctionalize the device of the present invention, including imparting functionalities such as solvent solubility, hydrophilicity/hydrophobicity, charge transport property, and adhesion property.

The molybdenum complex or tungsten complex used for the positive hole injection transport layer of the device of the present invention can be easily synthesized with a small number of synthesizing steps by being appropriately selected, therefore, a device having a high efficiency can be produced at a low cost.

Most of the molybdenum complex or tungsten complex used for the device of the present invention has solvent solubility or high compatibility with the positive hole transport compound being used together. In this case, a thin film can be formed by the solution applying method, therefore, there are many advantages of the production process. In such a case of applying the solution applying method, the molybdenum complex or tungsten complex is less likely to aggregate similarly as a metal nanoparticle or pigment, for example, and has high stability in the solution, therefore, there is an advantage that the yield is high. In addition, in the case of forming the positive hole injection transport layer by the solution applying method, layers from the positive hole injection transport layer to the light emitting layer can be sequentially formed on a substrate having a liquid-repellent bank only by an applying process. Therefore, the above applying process is more simple and has an advantage of producing the device at lower cost compared with a process including after depositing the positive hole injection layer by a vapor deposition using a very fine mask or the like, forming the positive hole transport layer and the light emitting layer by the solution applying method, and further depositing a second electrode.

By the detection of anion by MALDI-TOF-MS, or the detection of pentavalent by the XPS measurement, it can be suggested that the reaction product of the molybdenum complex or tungsten complex is in the anion state.

The formation of the charge transfer complex can be suggested by the phenomenon observed by the 1H NMR measurement, for example, in which the shape of proton signal and a chemical shift value derived from the aromatic ring observed around 6 to 10 ppm regarding a charge transport compound change after the molybdenum complex is mixed with a solution of the charge transport compound compared with those before the molybdenum complex is mixed with the solution of the charge transport compound.

Hereinafter, a constitution of layers of the device of the present invention will be described.

The device of the present invention comprises a substrate, two or more electrodes facing each other disposed on the substrate and a positive hole injection transport layer disposed between two electrodes among the two or more electrodes.

The device of the present invention includes organic devices such as an organic EL element, an organic transistor, a dye-sensitized solar battery, an organic thin film solar battery, and an organic semiconductor, and even includes a quantum dot light emitting element and an oxide compound solar battery having the positive hole injection transport layer.

FIG. 1 is a sectional schematic diagram showing a basic constitution of layers of the organic device of the present invention. The basic constitution of layers of the device of the present invention comprises two electrodes (1 and 6) facing each other disposed on a substrate 7, and an organic layer 3 containing at least a positive hole injection transport layer 2 disposed between the two electrodes (1 and 6).

The substrate 7 is a support medium for forming layers constituting the device. It is not required for the substrate 7 to be disposed on the surface of the electrode 1, and may be disposed on the outermost surface of the device.

The positive hole injection transport layer 2 is a layer containing at least the reaction product of the molybdenum complex or tungsten complex and performing a function of injecting and/or transporting a positive hole from the electrode 1 to the organic layer 3.

The organic layer 3 is a layer which exhibits various functions depending on a type of the device by injecting and transporting the positive hole, and may comprise a single layer or two or more layers. In the case that the organic layer comprises two or more layers, the organic layer contains the positive hole injection transport layer, and further contains a layer which plays a central role in the function of the device (hereinafter, it will be referred to as a functional layer), and a layer which plays a supplementary role of the functional layer (hereinafter, it will be referred to as a supplementary layer). For example, in the case of the organic EL element, the positive hole transport layer further laminated on the surface of the positive hole injection transport layer corresponds to the supplementary layer, and the light emitting layer laminated on the surface of the positive hole transport layer corresponds to the functional layer.

The electrode 6 is disposed in a position where the organic layer 3 containing the positive hole injection transport layer 2 exists between the electrode 6 and the electrode 1 facing each other. In addition, if necessary, the device may have a third electrode, which is not shown in the figures. By applying an electric field to layers between the electrodes, the function of the device can be exhibited.

Figure 2:
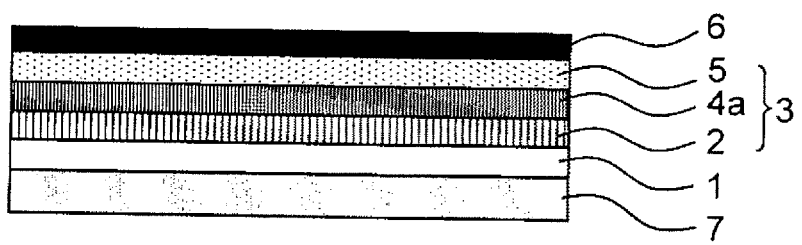
FIG. 2 is a schematic sectional view showing an example of a constitution of layers of the organic EL element being one embodiment of the device of the present invention.

FIG. 2 is a schematic sectional view showing an example of the constitution of layers of the organic EL element being one embodiment of the device of the present invention. The organic EL element of the present invention has an embodiment in which the positive hole injection transport layer 2 is laminated on the surface of the electrode 1, and the positive hole transport layer 4a and the light emitting layer 5 are laminated on the surface of the positive hole injection transport layer 2 as the supplementary layer and the functional layer respectively. In the case of using the positive hole injection transport layer characterized in the present invention at a position of the positive hole injection layer as above, the positive hole injection transport layer forms a charge transfer complex to be insoluble in the solvent used for the solution applying method in addition to improvement in electroconductivity, thus, it is possible to apply the solution applying method when the positive hole transport layer is laminated on the positive hole injection transport layer. Furthermore, the improvement in the adhesion to the electrode can be expected.

Figure 3:
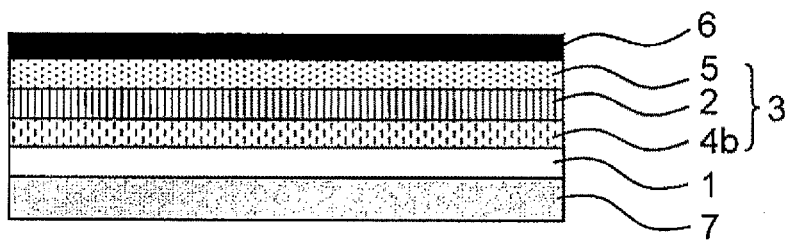
FIG. 3 is a schematic sectional view showing one of other examples of a constitution of layers of the organic EL element being one embodiment of the device of the present invention.

FIG. 3 is a schematic sectional view showing one of other examples of the constitution of layers of the organic EL element being one embodiment of the device of the present invention. The organic EL element of the present invention has an embodiment in which the positive hole injection layer 4b is formed on the surface of the electrode 1 as the supplementary layer, and the positive hole injection transport layer 2 and the light emitting layer 5 as the functional layer are laminated on the surface of the positive hole injection layer 4b. In the case of using the positive hole injection transport layer characterized in the present invention in a position of the positive hole injection layer as above, the positive hole injection transport layer forms the charge transfer complex to be insoluble in the solvent used for the solution applying method in addition to improvement in electroconductivity, thus, it is possible to apply the solution applying method when the light emitting layer is laminated on the positive hole injection transport layer.

Figure 4:
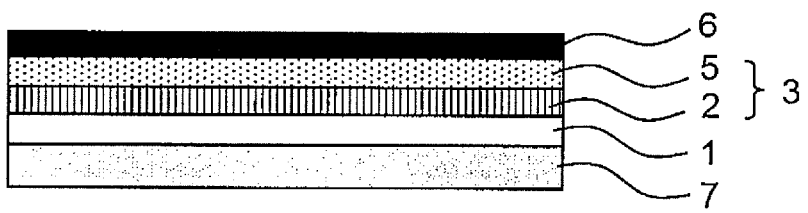
FIG. 4 is a schematic sectional view showing one of other examples of a constitution of layers of the organic EL element being one embodiment of the device of the present invention.

FIG. 4 is a schematic sectional view showing one of other examples of the constitution of layers of the organic EL element being one embodiment of the device of the present invention. The organic EL element of the present invention has an embodiment in which the positive hole injection transport layer 2 and the light emitting layer 5 as the functional layer are laminated in this order. In the case that the positive hole injection transport layer characterized in the present invention is used as a single layer as above, there is an advantage of reducing the number of steps in the process.

In FIGS. 2 to 4, each of the positive hole injection transport layer 2, the positive hole transport layer 4a, and the positive hole injection layer 4b may be constituted not by a single layer but by two or more layers.

In FIGS. 2 to 4, the electrode 1 functions as an anode and the electrode 6 functions as a cathode. The organic EL element has a function that, if the electric field is applied between the anode and cathode, the positive hole is injected from the anode to the light emitting layer 5 through the positive hole injection transport layer 2 and the positive hole transport layer 4, and the electron is injected from the cathode to the light emitting layer, thus, recombining of the injected positive hole and electron is performed in the light emitting layer 5 to emit light to the outside of the element.

In order to emit the light to the outside of the element, at least all layers on one surface of the light emitting layer are required to have permeability to the light of at least a part of wavelength in a visible wavelength range. In addition, if necessary, an electron transport layer and/or an electron injection layer may be disposed between the light emitting layer and the electrode 6 (cathode) (not shown in figures).

Figure 5:
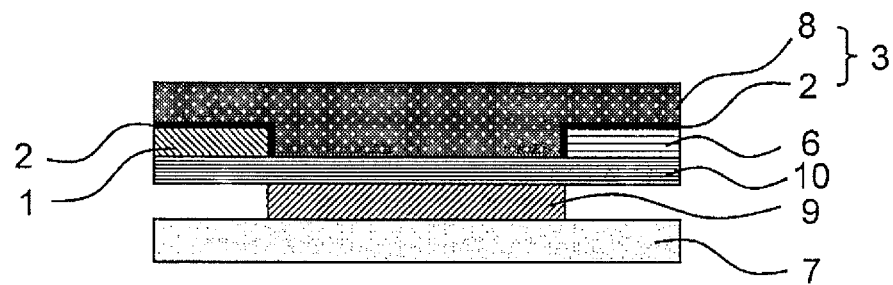
FIG. 5 is a schematic sectional view showing an example of a constitution of layers of the organic transistor being another embodiment of the device of the present invention.

FIG. 5 is a schematic sectional view showing an example of the constitution of layers of the organic transistor being another embodiment of the device of the present invention. The organic transistor comprises an electrode 9 (gate electrode), an electrode 1 (source electrode) and the electrode 6 (drain electrode) facing each other, an organic semiconductor layer 8 as the organic layer disposed between the electrode 9, the electrode 1 and the electrode 6, and an insulating layer 10 interposed between the electrode 9 and the electrode 1, and the electrode 9 and the electrode 6 on a substrate 7, and the positive hole injection transport layer 2 is formed on the surfaces of the electrode 1 and electrode 6.

The above organic transistor has a function of controlling currents between the source electrode and drain electrode by controlling the accumulation of the charges in the gate electrode.

Figure 6:
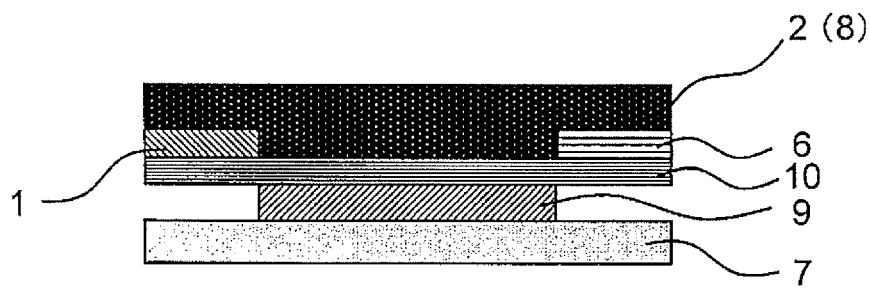
FIG. 6 is a schematic sectional view showing one of other examples of a constitution of layers of the organic transistor being another embodiment of the device of the present invention.

FIG. 6 is a schematic sectional view showing an example of another constitution of layers of the organic transistor being the embodiment of the device of the present invention. The organic transistor comprises an electrode 9 (gate electrode), an electrode 1 (source electrode) and an electrode 6 (drain electrode) facing each other, an organic semiconductor layer 8 consisting of the positive hole injection transport layer 2 of the present invention being formed as the organic layer disposed between the electrode 9, the electrode 1 and the electrode 6, and an insulating layer 10 interposed between the electrode 9 and the electrode 1, and the electrode 9 and the electrode 6 on a substrate 7. In this example, the positive hole injection transport layer 2 functions as the organic semiconductor layer 8.

The constitution of layers of the device of the present invention is not limited to the above examples, and one having a constitution substantially as same as the technical idea disclosed in claims of the present invention and providing similar function effects is included in the technical scope of the present invention.

Hereinafter, each layer of the device of the present invention will be described in detail.

(1) Positive Hole Injection Transport Layer

The device of the present invention contains at least the positive hole injection transport layer. In the case that the device of the present invention is an organic device and the organic layer comprises two or more layers, the organic layer contains the positive hole injection transport layer, and further contains a layer which plays a central role in the function of the device, and a supplementary layer which plays a supplementary role in supporting the functional layer. The functional layer and the supplementary layer will be described in detail in the specific example of the device that will be hereinafter described.

The positive hole injection transport layer of the device of the present invention contains at least a reaction product of a molybdenum complex or tungsten complex. The positive hole injection transport layer of the device of the present invention may only comprise the reaction product of the molybdenum complex or tungsten complex, but may further contain other components. In particular, it is preferable that the positive hole injection transport layer further contains the positive hole transport compound from the viewpoint of lowering driving voltage and further extending an element lifetime. The reaction product of the molybdenum complex or tungsten complex which may be contained in the positive hole injection transport layer of the present invention means a reaction product produced by a reaction of the molybdenum complex or tungsten complex occurred in the process of forming the positive hole injection transport layer, for example, in an ink for forming the positive hole injection transport layer (coating solution), when or after forming a layer, upon heating, upon light irradiation, upon using active oxygen, upon element driving, and the like. The reaction product of the molybdenum complex or tungsten complex used here means the reaction product containing molybdenum or tungsten.

In the case that the positive hole injection transport layer of the device of the present invention further contains the positive hole transport compound, the positive hole injection transport layer of the device of the present invention may only comprise a mixed layer containing the reaction product of the molybdenum complex or tungsten complex and the positive hole transport compound, or may comprise two or more layers including the mixed layer. In addition, the positive hole injection transport layer may comprise two or more layers in which a layer containing the reaction product of the molybdenum complex or tungsten complex and a layer containing the positive hole transport compound are laminated. Furthermore, the positive hole injection transport layer may be a layer in which at least a layer containing the reaction product of the molybdenum complex or tungsten complex and a layer containing at least the reaction product of the molybdenum complex or tungsten complex and the positive hole transport compound are laminated.

The molybdenum complex used in the present invention means a coordination compound containing molybdenum, and the molybdenum complex contains a ligand besides molybdenum. The molybdenum complex includes complexes having an oxidation number from −2 to +6. The tungsten complex used in the present invention is a coordination compound containing tungsten, and the tungsten complex contains a ligand besides tungsten. Also, the tungsten complex includes complexes having an oxidation number from −2 to +6. The tungsten complex has a tendency similar to the molybdenum complex, such as being likely to become multinucleate and to have an oxo ligand, and the coordination number can be 7 or more. The type of the ligand is appropriately selected and not particularly limited, however, it is preferable that the ligand contains an organic part (carbon atom) from the viewpoint of solvent solubility and the adhesion to the adjacent organic layer. In addition, it is preferable that the ligand separates from the complex at relatively low temperature (for example, 200° C. or less).

Examples of a unidentate ligand include an acyl, a carbonyl, a thiocyanate, an isocyanate, a cyanate, an isocyanate group and a halogen atom. In particular, hexacarbonyl, which easily separates from the complex at relatively low temperature, is preferable.

In addition, specific examples of the structure containing an aromatic ring and/or heterocyclic ring include benzene, triphenylamine, fluorene, biphenyl, pyrene, anthracene, carbazole, phenylpyridine, trithiophene, phenyloxadiazole, phenyltriazole, benzimidazole, phenyltriazine, benzodiathiazine, phenylquinoxaline, phenylenevinylene, phenylsilole, and a combination of the above structures.

Unless the effect of the present invention is interfered, the structure containing the aromatic ring and/or heterocyclic ring may contain a substituent. Examples of the substituent include a linear or branched alkyl group having 1 to 20 carbon atoms, a halogen atom, an alkoxy group having 1 to 20 carbon atoms, a cyano group, and a nitro group. In the linear or branched alkyl group having 1 to 20 carbon atoms, a linear or branched alkyl group having 1 to 12 carbon atoms, for example, a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, etc. is preferable.

In addition, as the ligand, the unidentate ligand or a bidentate ligand is preferable from the viewpoint of increasing the reactivity of the molybdenum complex.

If the complex itself is stabilized too much, the reactivity may decrease.

Examples of a molybdenum complex having an oxidation number of 0 or less include metal carbonyl $[Mo^{-II}(CO)_5]^{2-}$, $[(CO)_5Mo^{-I}Mo^{-I}(CO)_5]^{2-}$, and $[Mo(CO)_6]$.

In addition, as a molybdenum (I) complex having an oxidation number of +1, a non Werner type complex containing diphosphane or $\eta^5$-cyclopentadienide can be exemplified, and the specific examples include $Mo^I(\eta^6\text{-}C_6H_6)_2]^+$ and $[MoCl(N_2)(diphos)_2]$ (diphos is a bidentate ligand $(C_6H_5)_2PCH_2CH_2P(C_6H_5)_2)$.

As a molybdenum (II) complex having an oxidation number of +2, a $Mo_2$ compound, in which molybdenum becomes a binuclear complex and is in the state of $(Mo_2)^{4+}$ ion, can be exemplified. The examples include $[Mo_2(RCOO)_4]$ and $[Mo_2X_2L_2(RCOO)_4]$. "R" of the RCOO as used herein refers to a hydrocarbon group which may have a substituent, and various kinds of a carboxylic acid can be used. Examples of the carboxylic acid include fatty acid such as formic acid, acetic acid, propionic acid, butyric acid, valeric acid; halogenated alkyl carboxylic acid such as trifluoromethanecarboxylic acid; hydrocarbon aromatic carboxylic acid such as benzoic acid, naphthalenecarboxylic acid, anthracene carboxylic acid, 2-phenylpropane acid, cinnamic acid, fluorene carboxylic acid; and heterocyclic carboxylic acid such as furancarboxylic acid, thiophene carboxylic acid, and pyridinecarboxylic acid. In addition, the carboxylic acid may be the positive hole transport compound that will be described hereinafter (arylamine derivative, carbazole derivative, thiophene derivative, fluorene derivative, and distyryl benzene derivative) having a carboxy group. In particular, the structure as described above containing the aromatic ring and/or heterocyclic ring is suitably used for the carboxylic acid. Since the carboxylic acid has many choices, the carboxylic acid is a suitable for optimizing the interaction with the positive hole transport compound to be mixed, positive hole injection transport function, and the adhesion to the adjacent layer. In addition, "X" used herein refers to halogen or alkoxide. Chlorine, bromine, iodine, methoxide, ethoxide, isopropoxide, sec-butoxide and tert-butoxide can be used for "X". In addition, "L" used herein refers to a neutral ligand. Trialkylphosphine such as $P(n\text{-}C_4H_9)_3$ and $P(CH_3)_3$, and triarylphosphine such as triphenylphosphine can be used for "L".

As the molybdenum (II) complex having an oxidation number of +2, halogen complexes such as $[Mo^{II}_2X_4L_4]$ and $[Mo^{II}X_2L_4]$ can be further used, and the examples include $[Mo^{II}Br_4(P(n\text{-}C_4H_9)_3)_4]$ and $[Mo^{II}I_2(\text{diars}))_2]$ (diars is diarsine $(CH_3)_2As\text{---}C_6H_4\text{---}As(CH_3)_2)$.

Examples of a molybdenum (III) complex having an oxidation number of +3 include $[(RO)_3Mo\equiv Mo(OR)_3]$ and $[Mo(CN)^7(H_2O)]^{4-}$. "R" refers to the linear or branched alkyl group having 1 to 20 carbon atoms. In the linear or branched alkyl group having 1 to 20 carbon atoms, it is preferable to use the linear or branched alkyl group having 1 to 12 carbon atoms, such as a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, and a dodecyl group.

In addition, examples of a molybdenum (IV) complex having an oxidation number of +4 include $[Mo\{N(CH_3)_2\}_4]$, $[Mo(CN)_8]^{4-}$, a complex of $MoO^{2+}$ having an oxo ligand and a complex of $Mo_2O_2^{4+}$ which is doubly-crosslinked by $O^{2-}$.

An example of a molybdenum (V) complex having an oxidation number of +5 includes $[Mo(CN)_8]^{3-}$. The example includes an oxo complex having binuclear $Mo_2O_3^{4+}$ in which $Mo=O$ is crosslinked by $O^{2-}$ at trans position such as xanthate complex $Mo_2O_3(S_2COC_2H_5)_4$. The example includes an oxo complex having binuclear $Mo_2O_4^{2+}$ in which $Mo=O$ is doubly-crosslinked by $O^{2-}$ at cis position such as histidine complex $Mo_2O_4(L\text{-histidine})_2 \cdot 3H_2O$.

In addition, an example of a molybdenum (VI) complex having an oxidation number of +6 includes $MoO_2$(acetylacetonate)$_2$]. The complex having two or more nuclei includes a mixed-valence complex.

Examples of a tungsten complex having an oxidation number of 0 or less include metal carbonyl $[W^{-II}(CO)_5]^{2-}$, $[(CO)_5W^{-I}W^{-I}(CO)_5]^{2-}$ and $[W(CO)_6]$.

In addition, as a tungsten (I) complex having an oxidation number of +1, the non Werner type complex containing diphosphane and $\eta^5$-cyclopentadienide can be exemplified, and the specific examples include $W^I(\eta^6\text{-}C_6H_6)_2]^+$, and $[WCl(N_2)(diphos)_2]$ (diphos is bidentate ligand $(C_6H_5)_2PCH_2CH_2P(C_6H_5)_2)$.

As a tungsten (II) complex having an oxidation number of +2, a $W_2$ compound, in which tungsten becomes a binuclear complex and is in the state of $(W_2)^{4+}$ ion, can be exemplified.

The examples include $[W_2(RCOO)_4]$ and $[W_2X_2L_2(RCOO)_4]$. As "R" of the RCOO as used herein, the same ones described in the molybdenum complex can be used. As the tungsten (II) complex having an oxidation number of +2, the halogen complexes such as $[W^{II}_2X_4L_4]$ and $[W^{II}X_2L_4]$ can be further used, and the examples include $[W^{III}Br_4(P(n\text{-}C_4H_9)_3)_4]$ and $[W^{III}I_2(diars)_2]$ (diars is diarsine $(CH_3)_2As\text{---}C_6H_4\text{---}As(CH_3)_2$).

Examples of a tungsten (III) complex having an oxidation number of +3 include $[(RO)_3W\!=\!W(OR)_3]$ and $[W(CN)_7(H_2O)]^{4-}$. "R" refers to the linear or branched alkyl group having 1 to 20 carbon atoms.

In addition, examples of a tungsten (IV) complex having an oxidation number of +4 include $[W\{N(CH_3)_2\}_4]$, $[W(CN)_8]^{4-}$, a complex of $WO^{2+}$ having an oxo ligand and a complex of $W_2O_2^{4+}$ which is doubly-crosslinked by $O^{2-}$.

An example of a tungsten (V) complex having an oxidation number of +5 includes $[W(CN)_8]^{3-}$. The example includes an oxo complex having binuclear $W_2O_3^{4+}$ in which $W\!=\!O$ is crosslinked by $O^{2-}$ at trans position such as xanthate complex $W_2O_3(S_2COC_2H_5)_4$. The example includes an oxo complex having binuclear $W_2O_4^{2+}$ in which $W\!=\!O$ is doubly-crosslinked by $O^{2-}$ at cis position such as histidine complex $[W_2O_4(L\text{-histidine})_2]\cdot 3H_2O$.

In addition, an example of a tungsten (VI) complex having an oxidation number of +6 includes $WO_2(\text{acetylacetonate})_2]$. The complex having two or more nuclei includes a mixed-valence complex.

It is preferable that the reaction product of the molybdenum complex or tungsten complex is a composite of molybdenum having an oxidation number of +5 and molybdenum having an oxidation number of +6, or a composite of tungsten having an oxidation number of +5 and tungsten having an oxidation number of +6 respectively, from the viewpoint of lowering driving voltage and extending an element lifetime. Furthermore, it is preferable that the reaction product of the molybdenum complex or tungsten complex is the composite of molybdenum having an oxidation number of +5 and molybdenum having an oxidation number of +6, or the composite of tungsten having an oxidation number of +5 and tungsten having an oxidation number of +6 respectively, and the reaction product of the molybdenum complex or tungsten complex is in an anion state, from the viewpoint of lowering driving voltage and extending the element lifetime.

In the case that the reaction product of the molybdenum complex or tungsten complex is the composite of molybdenum having an oxidation number of +5 and molybdenum having an oxidation number of +6, or the composite of tungsten having an oxidation number of +5 and tungsten having an oxidation number of +6, 10 mol or more of molybdenum or tungsten having an oxidation number of +5 is preferable with respect to 100 mol of molybdenum or tungsten having an oxidation number of +6 from the viewpoint of lowering driving voltage and extending the element lifetime.

It is preferable that the reaction product of the molybdenum complex or tungsten complex is respectively the molybdenum oxide or tungsten oxide produced by the reaction of the molybdenum complex or tungsten complex and an organic solvent having a carbonyl group and/or hydroxyl group. Since the molybdenum complex or tungsten complex has high reactivity, if heating or light irradiation are performed, or active oxygen is used in the process of forming the positive hole injection transport layer, for example, in the ink for forming the positive hole injection transport layer, or upon forming a layer using the ink, in the case that an organic solvent contained in the ink for forming the positive hole injection transport layer is an organic solvent containing a carbonyl group and/or hydroxyl group, a redox reaction of the molybdenum complex or tungsten complex and the organic solvent is performed, thus, at least a part of the complex becomes a molybdenum oxide or tungsten oxide. In such a case, the composite of molybdenum having an oxidation number of +5 and molybdenum having an oxidation number of +6, or the composite of tungsten having an oxidation number of +5 and tungsten having an oxidation number of +6 can be formed in the anion state, and the state containing a relatively larger amount of originally unstable molybdenum having an oxidation number of +5 or tungsten having an oxidation number of +5 can be kept. Therefore, such a case is preferable from the viewpoint of lowering driving voltage and extending the element lifetime.

The organic solvent containing the carbonyl group and/or hydroxyl group used in the present invention is not particularly limited as long as the redox reaction of the organic solvent and the molybdenum complex or tungsten complex is appropriately performed.

Examples of the organic solvent containing the carbonyl group and/or hydroxyl group include aldehydes, ketones, carboxylic acids, esters, amides, alcohols and phenols, and ones having boiling temperatures from 50 to 250° C. can be suitably used. Specific examples of the organic solvent containing the carbonyl group and/or hydroxyl group include ketone solvents such as acetone, methyl ethyl ketone, 2-pentanone, 3-pentanone, 2-hexanone, 2-heptanone, 4-heptanone, methyl isopropyl ketone, diisobutylketone, acetonylacetone, isophorone, and cyclohexanone; aldehyde solvents such as acetaldehyde, propionaldehyde, furfural, and benzaldehyde; carboxylic acid solvents such as acetic acid, propionic acid, butyric acid, and valeric acid; ester solvents such as ethyl acetate, n-propyl acetate, i-propyl acetate, n-butyl acetate, i-butyl acetate, n-amyl acetate, ethylbenzoate and butylbenzoate; amide solvents such as N-methylformamide, N,N-dimethylformamide, and N-ethylacetamide; alcohol solvents such as methyl alcohol, ethyl alcohol, propyl alcohol, isopropyl alcohol, glycerin, ethylene glycol, propylene glycol, 1,2-butylene glycol, cyclohexanol, ethylene glycol monomethyl ether, ethylene glycol monoethyl ether, and diethylene glycol monoethyl ether; and phenol solvents such as phenol, cresol, xylenol, ethylphenol, trimethylphenol, isopropyl phenol, and t-butylphenol.

On the other hand, as the positive hole transport compound used in the present invention, a compound having positive hole transport property can be appropriately used. The positive hole transport property as used herein means that overcurrent by positive hole transport is observed by a known photocurrent method.

As the positive hole transport compound, a polymer compound is suitably used besides a low molecular weight compound. A positive hole transport polymer compound means a polymer compound having the positive hole transport property and a weight-average molecular weight of 2,000 or more in terms of polystyrene by gel permeation chromatography. In the positive hole injection transport layer of the present invention, as a positive hole transport material, it is preferable to use a polymer compound easily soluble in the organic solvent and capable of forming a stable coating film in which compounds hardly aggregates, in order to form a stable film by the solution applying method.

The positive hole transport compound is not particularly limited, and the examples include arylamine derivatives, anthracene derivatives, carbazole derivatives, thiophene derivatives, fluorene derivatives, distyryl benzene derivatives, and spiro compounds. Specific examples of the arylamine derivatives include N,N'-bis-(3-methylphenyl)-N,N'-bis- (phenyl)-benzidine (TPD), bis(N-(1-naphthyl-N-phenyl) benzidine) (α-NPD), 4,4',4''-tris(3-methylphenylphenylamino)triphenylamine (MTDATA), and 4,4',4''-tris(N-(2-naphthyl)-N-phenylamino)triphenylamine (2-TNATA). Specific examples of the carbazole derivatives include 4,4-N,N'-dicarbazole-biphenyl (CBP), etc. Specific examples of the fluorene derivatives include N,N'-bis(3-methylphenyl)-N,N'-bis(phenyl)-9,9-dimethylfluorene (DMFL-TPD), etc. Specific examples of the distyryl benzene derivatives include 4-(di-p-tolylamino)-4'-[(di-p-tolylamino)styryl]stilbene (DPAVB), etc. Specific examples of the Spiro compounds include 2,7-bis(N-naphthalene-1-yl-N-phenylamino)-9,9-spirobifluorene (Spiro-NPB), and 2,2',7,7'-tetrakis(N,N-diphenylamino)-9,9'-spirobifluorene (Spiro-TAD).

In addition, as the positive hole transport polymer compound, a polymer containing an arylamine derivative, an anthracene derivative, a carbazole derivative, a thiophene derivative, a fluorene derivative, a distyryl benzene derivative, or a Spiro compound in a repeating unit can be exemplified.

Specific examples of the polymers containing the arylamine derivative in the repeating unit include non-conjugated polymers such as copoly [3,3'-hydroxy-tetraphenyl-benzidine/diethylene glycol]carbonate (PC-TPD-DEG), PTPDES and Et-PTPDEK represented by the structures described below, and conjugated polymers such as poly[N,N'-bis(4-butylphenyl)-N,N'-bis(phenyl)-benzidine]. Specific examples of the polymers containing the anthracene derivative in the repeating unit include poly[(9,9-dioctylfluorenyl-2,7-diyl)-co-(9,10-anthracene)], etc. Specific examples of the polymers containing the carbazole in the repeating unit include polyvinylcarbazole (PVK), etc. Specific examples of the polymers containing the thiophene derivative in the repeating unit include poly[(9,9-dioctylfluorenyl-2,7-diyl)-co-(bithiophene)], etc. Specific examples of the polymers containing the fluorene derivative in the repeating unit include poly[(9,9-dioctylfluorenyl-2,7-diyl)-co-(4,4'-(N-(4-sec-butylphenyl))diphenylamine)] (TFB), etc. Specific examples of the polymers containing the Spiro compound in the repeating unit include poly[(9,9-dioctylfluorenyl-2,7-diyl)-alt-co-(9,9'-spiro-bifluorene-2,7-diyl)], etc. These positive hole transport polymer compounds may be used alone or in combination of two or more kinds.

Among the above, it is preferable that the positive hole transport polymer compound is a compound represented by the following formula (1) from the viewpoint of obtaining good stability of adhesion to the adjacent organic layer and having the HOMO energy value between an anode substrate and a light emitting layer material.

[Chemical formula 2]

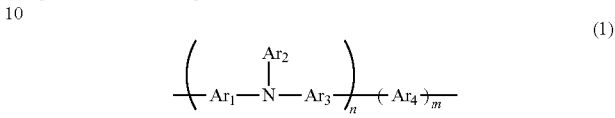

(1)

wherein $Ar_1$ to $Ar_4$ may be the same or different from each other; each of $Ar_1$ to $Ar_4$ represents an unsubstituted or substituted aromatic hydrocarbon group comprising 6 or more and 60 or less carbon atoms relating to a conjugated bond, or an unsubstituted or substituted heterocyclic group comprising 4 or more and 60 or less carbon atoms relating to the conjugated bond; "n" is 0 to 10,000; "m" is 0 to 10,000; "n+m" is 10 to 20,000; and the arrangement of two repeating units is arbitrarily selected.

The arrangement of two repeating units is arbitrarily selected. For example, it may be any of a random copolymer, alternative copolymer, periodic copolymer and block copolymer.

The average of "n" is preferably from 5 to 5,000, more preferably from 10 to 3,000. The average of "m" is preferably from 5 to 5,000, more preferably from 10 to 3,000. In addition, the average of "n+m" is preferably from 10 to 10,000, more preferably from 20 to 6,000.

In $Ar_1$ to $Ar_4$ of the above formula (1), specific examples of an aromatic hydrocarbon in the aromatic hydrocarbon group include benzene, fluorene, naphthalene, anthracene, a combination thereof, derivatives thereof, phenylenevinylene derivatives, and styryl derivatives. In addition, specific examples of a heterocyclic ring in the heterocyclic group include thiophene, pyridine, pyrrole, carbazole, a combination thereof, and derivatives thereof.

In the case that $Ar_1$ to $Ar_4$ of the above formula (1) contain a substituent, the substituent is preferably a linear or branched

[Chemical formula 1]

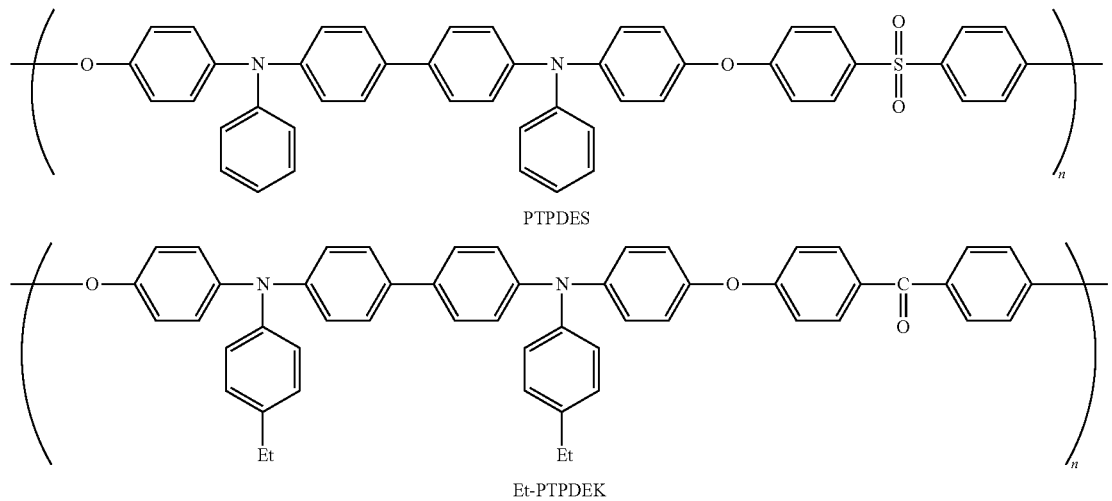

PTPDES

Et-PTPDEK alkyl group or alkenyl group having 1 to 12 carbon atoms, such as a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, a vinyl group, and an allyl group.

Preferable specific examples of the compound represented by the above formula (1) include poly[(9,9-dioctylfluorenyl-2,7-diyl)-co-(4,4'-(N-(4-sec-butylphenyl))diphenylamine)] (TFB) represented by the following formula (2), poly[(9,9-dioctylfluorenyl-2,7-diyl)-alt-co-(N,N'-bis{4-butylphenyl}-benzidine N,N'-{1,4-diphenylene})] represented by the following formula (3), and poly[(9,9-dioctylfluorenyl-2,7-diyl)] (PFO) represented by the following formula (4).

may contain an additive such as a binder resin, a curable resin or a coating property improver. Examples of the binder resin include a polycarbonate, a polystyrene, a polyarylate, and a polyester, and a binder resin which can be cured by heat or light may be contained. As the material which can be cured by heat or light, the positive hole transport compound having a curable functional group in the molecule or a curable resin can be used. Specific examples of the curable functional group include acrylic functional groups such as an acryloyl group and a methacryloyl group; a vinylene group; an epoxy group; and an isocyanate group. The curable resin may be a thermosetting resin or photocurable resin, and the examples include an epoxy resin, a phenol resin, a melamine resin, a polyester resin, a polyurethane resin, a silicon resin, and a silane coupling agent.

[Chemical Formula 3]

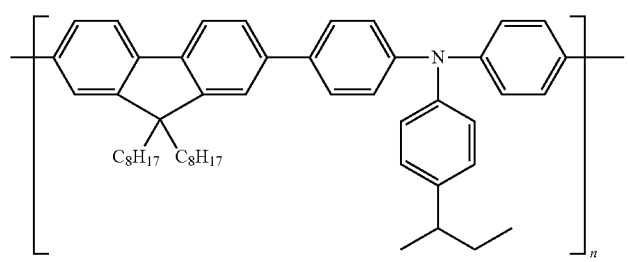

(2)

[Chemical Formula 4]

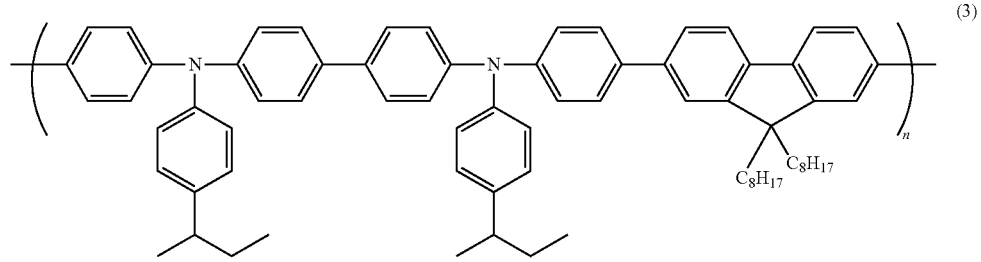

(3)

[Chemical Formula 5]

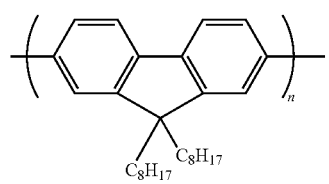

(4)

In the case of using the positive hole transport compound in the positive hole injection transport layer of the present invention, the content of the positive hole transport compound is preferably from 10 to 10,000 parts by weight with respect to 100 parts by weight of the reaction product of the molybdenum complex or tungsten complex from the viewpoint of improving the positive hole injection transport property and achieving a long lifetime due to high stability of a film.

If the content of the positive hole transport compound in the positive hole injection transport layer is too low, it may be difficult to obtain the synergistic effect of having the positive hole transport compound mixed. On the other hand, if the content of the positive hole transport compound is too high, it becomes difficult to obtain the effect of using the molybdenum complex or tungsten complex.

Unless the effect of the present invention is interfered, the positive hole injection transport layer of the present invention The film thickness of the positive hole injection transport layer can be appropriately determined according to the purpose or an adjacent layer thereof, and is generally from 0.1 to 1,000 nm, preferably from 1 to 500 nm.

In addition, the work function of the positive hole injection transport layer is preferably from 5.0 to 6.0 eV, more preferably from 5.0 to 5.8 eV, from the viewpoint of positive hole injection efficiency.

It is preferable that the positive hole injection transport layer of the present invention is formed by the solution applying method from the viewpoint of easy production process and high yield since it is less likely to short out, and achieving a long lifetime due to formation of a charge transfer complex. In particular, it is preferable that the positive hole injection transport layer of the present invention is formed by the solution applying method using a solution (ink for forming a positive hole injection transport layer) dissolved or dispersed in the solvent in which at least the molybdenum complex or tungsten complex is suitably dissolved or dispersed. In addition, in the case that the positive hole transport compound is also used, it is preferable that the positive hole injection transport layer of the present invention is formed by the solution applying method using a solution in which the molybdenum complex or tungsten complex and the positive hole transport compound are mixed in the solvent in which both the above complex and the compound are suitably dissolved or dispersed. In this case, if the molybdenum complex or tungsten complex and the positive hole transport compound are mixed in the solvent in which both the molybdenum complex or tungsten complex and the positive hole transport compound are suitably dissolved or dispersed, the reaction product of the molybdenum complex or tungsten complex and the positive hole transport compound are interacted each other and the charge transfer complex is easily formed, thus, the positive hole injection transport layer having an excellent positive hole transport property and temporal stability of a film can be formed. As described above, the positive hole injection transport layer which forms the charge transfer complex tends to be insoluble in the solvent used when the positive hole injection transport layer is formed, therefore, even in the case of forming the organic layer which corresponds to the layer on the positive hole injection transport layer, a possibility of using the solution applying method can be expanded without eluting the positive hole injection transport layer.

The solution applying method will be described in "Method for producing device" described hereinafter.

(2) Substrate

The substrate is a support medium of the device of the present invention. The material of the substrate may be, for example, a flexible material or a hard material. Examples of the material which can be specifically used include a glass, a quartz, a polyethylene, a polypropylene, a polyethylene a terephthalate, a polymethacrylate, a polymethylmethacrylate, a polymethylacrylate, a polyester, and a polycarbonate.

Among the above, in the case of using a substrate made of a synthetic resin, it preferably has gas barrier property. The thickness of the substrate is not particularly limited, and is generally from around 0.5 to 2.0 mm.

(3) Electrode

The device of the present invention comprises the substrate, and two or more electrodes facing each other disposed on the substrate.

In the device of the present invention, the electrode is preferably formed of a metal or a metal oxide, and a known material can be appropriately employed. Generally, the electrode can be formed of a metal such as aluminum, gold, silver, nickel, palladium or platinum, or a metal oxide such as an oxide of indium and/or tin, etc.

Generally, there are many cases that the electrode is formed on the substrate by a method such as a sputtering method or a vacuum vapor deposition method, however, it can be formed by a wet process such as a coating method or a dip method. The thickness of the electrode varies depending on transparency or the like required for each electrode. If the transparency is required, the light transmittance in a visible light wavelength region of the electrode is generally 60% or more, preferably 80% or more. In this case, the thickness of the electrode is generally from about 10 to 1,000 nm, preferably from about 20 to 500 nm.

In the present invention, the device may further comprise a metal layer on the electrode to improve the stability of adhesion to a charge injection material. The metal layer means a layer containing a metal, and is formed of the metal or the metal oxide generally used for the electrode described above.

(4) Others

The device of the present invention may comprise a known electron injection layer and/or electron transport layer, if necessary, between an electron injection electrode and the positive hole injection transport layer.

2. Organic EL Element

As an embodiment of the device of the present invention, an organic EL element comprising the organic layer containing at least the positive hole injection transport layer of the present invention and the light emitting layer can be exemplified.

Hereinafter, layers which constitute the organic EL element will be described in order using FIGS. 2 to 4.

(Substrate)

The substrate 7 is a support medium of the organic EL element. The material of the substrate may be, for example, a flexible material or a hard material. Specifically, for example, one described in "Substrate" for the device can be used.

If light emitted at the light emitting layer 5 transmits the substrate 7 side and is taken therefrom, at least the substrate 7 is required to be a transparent material.

(Anode and Cathode)

Either the electrode 1 or the electrode 6 is required to have transparency depending on the direction that light emitted at the light emitting layer 5 is taken. The electrode 1 needs to be formed of a transparent material if light emitted from the light emitting layer 5 is taken from the substrate 7 side, and the electrode 6 needs to be formed of a transparent material if light emitted from the light emitting layer 5 is taken from the electrode 6 side.

The electrode 1 disposed on the light emitting layer side of the substrate 7 functions as an anode which injects a positive hole to the light emitting layer, and the electrode 6 disposed on the light emitting layer side of the substrate 7 functions as a cathode which injects an electron to the light emitting layer 5.

In the present invention, it is preferable that the anode and cathode are formed of the metal or metal oxide described in "Electrode" for the device described above.

(Positive Hole Injection Transport Layer, Positive Hole Transport Layer, and Positive Hole Injection Layer)

As shown in FIGS. 2 to 4, the positive hole injection transport layer 2, the positive hole transport layer 4a, and the positive hole injection layer 4b are appropriately formed between the light emitting layer 5 and the electrode 1 (anode). As shown in FIG. 2, the positive hole transport layer 4a is further laminated on the positive hole injection transport layer 2 of the present invention, and the light emitting layer may be laminated thereon. As shown in FIG. 3, the positive hole injection transport layer 2 of the present invention is further laminated on the positive hole injection layer 4b, and the light emitting layer may be laminated thereon. As shown in FIG. 4, the positive hole injection transport layer 2 of the present invention is laminated on the electrode 1, and the light emitting layer is laminated thereon.

As shown in FIG. 2, in the case that the positive hole transport layer 4a is further laminated on the positive hole injection transport layer 2 of the present invention, a positive hole transport material used for the positive hole transport layer 4a is not particularly limited, and the positive hole transport compound described in "Positive hole injection transport layer" of the present invention is preferably used. Among the above, it is preferable to use a compound similar to the positive hole transport compound used for the adjacent positive hole injection transport layer 2 of the present invention from the viewpoint of improving the stability of adhesion of the interface between the positive hole injection transport layer and the positive hole transport layer, and contributing to the achievement of a long driving lifetime.

The positive hole transport layer 4a can be formed of the positive hole transport material by a method similar to that of the light emitting layer that will be described hereinafter. The thickness of the positive hole transport layer 4a is generally from 0.1 to 1 μm, preferably from 1 to 500 nm.

As shown in FIG. 3, in the case that the positive hole injection transport layer 2 of the present invention is further laminated on the positive hole injection layer 4b, a positive hole injection material used for the positive hole injection layer 4b is not particularly limited, and a known compound can be used. Examples of the compound include phenylamines; starburst-type amines; phthalocyanines; oxides such as a vanadium oxide, a molybdenum oxide, a ruthenium oxide and an aluminum oxide; amorphous carbon; and derivatives of polyaniline and polythiophene.

The positive hole injection layer 4b can be formed of the positive hole injection material by a method similar to that of the light emitting layer that will be described hereinafter. The thickness of the positive hole injection layer 4b is generally from 1 nm to 1 μm, preferably from 2 to 500 nm, more preferably from 5 to 200 nm.

Furthermore, considering positive hole injection property, it is preferable that the positive hole injection material and positive hole transport material may be selected so as to make the value of work function (HOMO) of each layer larger in a stepwise fashion from the electrode 1 side to the light emitting layer 5 being an organic layer so that an energy barrier of the positive hole injection at each interface reduces as much as possible, and a large energy barrier of the positive hole injection between the electrode 1 and the light emitting layer 5 is supplemented.

Specifically, for example, in the case that ITO (work function 5.0 eV right after UV ozon cleaning) is used for the electrode 1, and Alq3 (HOMO 5.7 eV) is used for the light emitting layer 5, it is preferable that a mixture of TFB (work function 5.4 eV) and a molybdenum complex (work function 5.0 eV) is selected as a material constituting the positive hole injection transport layer, and TFB (work function 5.4 eV) is selected as a material constituting the positive hole transport layer, and layers are arranged so as to have a layer constitution in which the value of the work function of each layer is sequentially larger from the electrode 1 side to the light emitting layer 5. The value measured by photoelectron spectroscopy by means of a photoelectron spectrometer (product name: AC-1; manufactured by Riken Keiki Co., Ltd.) is used for the value of the work function or HOMO described above.

In the case of such a layer constitution, the large energy barrier of the positive hole injection between the electrode 1 (work function 5.0 eV right after UV ozon cleaning) and the light emitting layer 5 (for example, HOMO 5.7 eV) can be supplemented so that the vales of HOMO become stepwise. Therefore, the positive hole injection transport layer having an excellent positive hole injection efficiency can be obtained.

(Light Emitting Layer)

As shown in FIGS. 2 to 4, the light emitting layer 5 is formed of an emitting material between the substrate 7 on which the electrode 1 is formed and the electrode 6.

The material used for the light emitting layer of the present invention is not particularly limited as long as it is generally used for the emitting material, and either a fluorescent material or a phosphorescent material can be used. More specifically, materials such as a dye based light emitting material and a metal complex based light emitting material can be exemplified, and either a low molecular weight compound or a polymer compound can be used.

(Specific Example of Dye Based Light Emitting Material)

Examples of the dye based light emitting material include arylamine derivatives, anthracene derivatives, (phenylanthracene derivatives), oxadiazole derivatives, oxazole derivatives, oligothiophene derivatives, carbazole derivatives, cyclopentadiene derivatives, silole derivatives, distyryl benzene derivatives, distyryl pyrazine derivatives, distyryl arylene derivatives, silole derivatives, stilbene derivatives, spiro compounds, thiophene ring compounds, tetraphenylbutadiene derivatives, triazole derivatives, triphenylamine derivatives, trifumanylamine derivatives, pyrazoloquinoline derivatives, hydrazone derivatives, pyrazoline dimers, pyridine ring compounds, fluorene derivatives, phenanthrolines, perinone derivatives, and perylene derivatives. In addition, a dimer, trimer or oligomer thereof, or a compound containing two or more kinds of derivatives can be used.

These materials may be used alone or in combination of two or more kinds.

(Specific Example of Metal Complex Based Light Emitting Material)

Examples of the metal complex based light emitting material include an aluminum quinolinol complex, a benzoquinolinol beryllium complex, a benzoxazole zinc complex, a benzothiazole zinc complex, an azomethyl zinc complex, a porphyrin zinc complex, and an europium complex; and a metal complex which has a central metal including Al, Zn, Be or the like or a rare-earth metal such as Tb, Eu, Dy, and has a ligand such as oxadiazole, thiadiazole, phenylpyridine, phenylbenzimidazole, and quinoline structure.

These materials may be used alone or in combination of two or more kinds.

(Polymer Light Emitting Material)

As the polymer light emitting material, a polymer or a dendrimer in which the above low molecular weight material is introduced in a molecule as a straight chain, a side chain, or a functional group can be used. The examples include poly p-phenylenevinylene derivatives, polythiophene derivatives, poly p-phenylene derivatives, polysilane derivatives, polyacetylene derivatives, polyvinylcarbazole derivatives, polyfluorenone derivatives, polyfluorene derivatives, polyquinoxaline derivatives, and copolymers thereof.

(Specific Example of Dopant)

A doping material may be added in the light emitting layer for the purpose of improving light emitting efficiency or changing a light emitting wavelength. In the case of a polymer material, the doping material may be contained in a molecular structure as a light emitting group. Examples of such a doping material include perylene derivatives, coumarin derivatives, rubrene derivatives, quinacridone derivatives, squarylium derivatives, porphyrin derivatives, a styryl dye, tetracene derivatives, pyrazoline derivatives, decacyclene, phenoxazone, quinoxaline derivatives, carbazole derivatives, and fluorene derivatives. In addition, a compound in which a Spiro group is introduced to one of the above derivatives can be used.

These materials may be used alone or in combination of two or more kinds.

In addition, as a phosphorescence dopant, an organometallic complex which has a heavy metal ion such as platinum or iridium in center and exhibits phosphorescence can be used. Specifically, $Ir(ppy)_3$, $(ppy)_2Ir(acac)$, $Ir(BQ)_3$, $(BQ)_2Ir(acac)$, $Ir(THP)_3$, $(THP)_2Ir(acac)$, $Ir(BO)_3$, $(BO)_2(acac)$, $Ir(BT)_3$, $(BT)_2Ir(acac)$, $Ir(BTP)_3$, $(BTP)_2Ir(acac)$, FIr6 or PtOEP can be used. These materials can be used alone or in combination of two or more kinds.

In the present invention, as the material for the light emitting layer, either a low molecular weight compound or a polymer compound which emits fluorescence, or a low molecular weight compound or a polymer compound which emits phosphorescence may be used. In the present invention, in the case that a base layer on which the light emitting layer is provided is the positive hole injection transport layer of the present invention, the positive hole injection transport layer forms the charge transfer complex to be insoluble in a nonaqueous solvent such as xylene or the like used for the solution applying method, therefore, as the material for the light emitting layer, it is possible to use the polymer material which can be easily soluble in the nonaqueous solvent such as xylene or the like and forms a layer by the solution applying method. In this case, a polymer compound which emits fluorescence, a polymer compound containing a low molecular weight compound which emits fluorescence, a polymer compound which emits phosphorescence, or a polymer compound containing a low molecular weight compound which emits phosphorescence can be suitably used.

The light emitting layer can be formed of the emitting material by the solution applying method, vapor deposition method or transfer method. A solution applying method and vapor deposition method similar to those in "Method for producing device" that will be described hereinafter can be used. The transfer method is a method, for example, that the light emitting layer formed on a film in advance by the solution applying method or vapor deposition method is attached on the positive hole injection transport layer 2 provided on the electrode, and the light emitting layer 5 is transferred on the positive hole injection transport layer 2 by heating. In addition, the positive hole injection transport layer side of a laminate in which the film, the light emitting layer 5, and the positive hole injection transport layer 2 are laminated in this order may be transferred on the electrode.

The thickness of the light emitting layer is generally from about 1 to 500 nm, preferably from about 20 to 1,000 nm. In the present invention, the positive hole injection transport layer is suitably formed by the solution applying method, therefore, there is an advantage of being able to reduce the process cost in the case that the light emitting layer is also formed by the solution applying method.

3. Organic Transistor

As another embodiment of the device of the present invention, an organic transistor can be exemplified. Hereinafter, layers constituting the organic transistor will be described using FIGS. 5 and 6.

In the organic transistor of the present invention as shown in FIG. 5, the positive hole injection transport layer 2 is formed on the surfaces of the electrode 1 (source electrode) and the electrode 6 (drain electrode) so that positive hole injection transport property between the electrode 1 and the organic semiconductor layer, and the electrode 6 and the organic semiconductor becomes high, and film stability of the positive hole injection transport layer of the present invention is high. Thereby, it contributes to the achievement of the long driving lifetime.

In the organic transistor of the present invention, as shown in FIG. 6, the positive hole injection transport layer 2 of the present invention may function as the organic semiconductor layer 8.

In addition, in the organic transistor of the present invention, as shown in FIG. 5, the positive hole injection transport layer 2 may be formed on the surfaces of the electrode 1 (source electrode) and electrode 6 (drain electrode), and the positive hole injection transport layer 2 of the present invention, which is made of a different material from that of the positive hole injection transport layer formed on the surface of the electrode may be further formed as the organic semiconductor layer 8.

In the case that the organic transistor as shown in FIG. 5 is formed, as the material which forms the organic semiconductor layer, a low molecular or polymer organic semiconductor material having a donating property (p type) can be used.

As the organic semiconductor material, examples to be used include porphyrin derivatives, arylamine derivatives, polyacene derivatives, perylene derivatives, rubrene derivatives, coronene derivatives, perylene tetracarboxylic acid diimide derivatives, perylene tetracarboxylic dianhydride derivatives, polythiophene derivatives, poly p-phenylene derivatives, poly p-phenylenevinylene derivatives, polypyrrole derivatives, polyaniline derivatives, polyfluorene derivatives, polythiophenevinylene derivatives, polythiophene-heterocyclic aromatic copolymers and derivatives thereof; α-6-thiophene, α-4-thiophene; oligoacene derivatives such as naphthalene; oligothiophene derivatives of α-5-thiophene, etc.; pyromellitic dianhydride derivatives; and pyromellitic diimide derivatives. Specifically, examples of the porphyrin derivatives include metalphthalocyanine such as phthalocyanine and copper phthalocyanine, examples of the arylamine derivatives include m-TDATA, and examples of the polyacene derivatives include naphthalene, anthracene, naphthacene, and pentacene. In addition, there can be used a layer having improved conductive property by mixing Lewis acid, tetrafluoro tetracyanoquinodimethane ($F_4$-TCNQ), an inorganic oxide such as vanadium or molybdenum with any of the porphyrin derivatives and triphenylamine derivatives.

Even in the case of forming the organic transistor comprising the positive hole injection transport layer of the present invention as shown in FIG. 5, as a compound constituting the organic semiconductor layer 8, it is preferable to use the positive hole transport compound, in particular, the positive hole transport polymer compound is used for the positive hole injection transport layer of the present invention, from the viewpoint of improving the stability of adhesion to the interface between the positive hole injection transport layer 2 of the present invention and the organic semiconductor layer 8, and contributing to the achievement of the long driving lifetime.

It is preferable that carrier mobility of the organic semiconductor layer is $10^{-6}$ cm/Vs or more, particularly for the organic transistor, $10^{-3}$ cm/Vs or more is preferable from the view point of transistor property.

In addition, the organic semiconductor layer can be formed by the solution applying method or a dry process similarly as the light emitting layer of the organic EL element.

The substrate, the gate electrode, the source electrode, the drain electrode and the insulating layer may not be particularly limited and can be formed by using the following materials.

The substrate 7 is a support medium of the device of the present invention. The material of the substrate may be, for example, a flexible material or a hard material. Specifically, a similar material to that of "Substrate" of the organic EL element can be used.

The material of the gate electrode, source electrode and drain electrode is not particularly limited if it is a conductive material. However, it is preferable that the material is a metal or a metal oxide from the viewpoint of forming the positive hole injection transport layer 2 wherein the coordination compound containing the metal ion is adsorbed using the charge transport material of the present invention. Specifically, a similar metal or metal oxide to that of the electrode of the organic EL element can be used, particularly, platinum, gold, silver, copper, aluminum, indium, ITO and carbon are preferable.

For the insulating layer which insulates the gate electrode, various kinds of insulating materials can be used. Also, either an inorganic oxide or an organic compound can be used, particularly, an inorganic oxide having high relative permittivity is preferable. Examples of the inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Among the above, silicon oxide, aluminum oxide, tantalum oxide and titanium oxide are preferable. Also, an inorganic nitride such as silicon nitride, or aluminum nitride can be suitably used.

As the organic compound, a polyimide, a polyamide, a polyester, a polyarylate, a photoradical polymerizable or photocationic polymerizable photocurable resin, a copolymer containing an acrylonitrile component, a polyvinylphenol, a polyvinylalcohol, a novolak resin, cyanoethylpullulan, or a phosphazene compound containing a polymer or an elastomer can be used.

Other constitutions of other organic devices such as a dye-sensitized solar battery, an organic thin film solar battery and an organic semiconductor, an oxide compound solar battery and a quantum dot light emitting element having the positive hole injection transport layer are not particularly limited as long as the above positive hole injection transport layer is the positive hole injection transport layer of the present invention, and may be the same as a known constitution.

4. Method for Producing Device

The method for producing the device of the present invention is a method for producing a device comprising the substrate, two or more electrodes facing each other disposed on the substrate and the positive hole injection transport layer disposed between two electrodes among the two or more electrodes comprising: the preparation step of preparing the ink for forming the positive hole injection transport layer containing the molybdenum complex or tungsten complex, and the organic solvent having a carbonyl group and/or hydroxyl group; the formation step of forming the positive hole injection transport layer on any of layers on the electrodes using the ink for forming the positive hole injection transport layer; and the oxidation step of oxidizing at least a part of the molybdenum complex or tungsten complex to produce the molybdenum oxide or tungsten oxide.

In the method for producing the device of the present invention, the positive hole injection transport layer is formed of the ink for forming the positive hole injection transport layer by the solution applying method as described above. By using the solution applying method, it is possible to form a device having a high productivity and the stability of adhesion of the interface between the electrode and positive hole injection transport layer, and between the positive hole injection transport layer and organic layer, which does not require a vapor deposition apparatus and can coat separately without using a mask vapor deposition or the like upon forming the positive hole injection transport layer.

The solution applying method used herein means a method for preparing the ink for forming the positive hole injection transport layer containing at least the molybdenum complex or tungsten complex, and the organic solvent having the carbonyl group and/or hydroxyl group, applying the ink on the electrode or on the layer being a base layer, and drying the ink to form the positive hole injection transport layer. The ink for forming the positive hole injection transport layer can be prepared, if necessary, by adding the positive hole transport compound and an additive such as a binder resin which does not trap a positive hole or a coating property improver in a solvent to dissolve and disperse.

Examples of the solution applying method include a dipping method, a spray coating method, a spin coating method, a blade coating method, a dip coating method, a cast method, a roll coating method, a bar coating method, a die-coating method, and a liquid dropping method such as an ink-jet method. In the case of forming a monomolecular film, the dipping method or the dip coating method is suitably used.

As the solvent used for the ink, an organic solvent capable of performing a redox reaction with the molybdenum complex or tungsten complex and having a carbonyl group and/or hydroxyl group is used. As such an organic solvent, a similar organic solvent to that described above can be used. Among the organic solvents having the carbonyl group and/or hydroxyl group, an organic solvent which can be suitably dissolved and dispersed with other components such as the positive hole transport compound is appropriately selected to be used.

The method for producing the device of the present invention comprises the oxidation step of oxidizing at least a part of the molybdenum complex or tungsten complex to produce the molybdenum oxide or tungsten oxide, thereby, it is possible to form a layer containing a molybdenum oxide or tungsten oxide which does not have solvent solubility not using the vapor deposition method but using the solution applying method. In addition, it is possible to change positive hole injection transport property appropriately while the adhesion to the adjacent organic layer is kept by oxidizing at least a part of the molybdenum complex or tungsten complex to produce the molybdenum oxide or tungsten oxide. Furthermore, it is possible to improve film strength by having the oxidation step.

In the method for producing the device of the present invention, after preparing the ink for forming the positive hole injection transport layer, the oxidation step may be performed before forming the positive hole injection transport layer, or after forming the positive hole injection transport layer.

That is, one embodiment of the method for producing the device of the present invention, a method comprising: the preparation step of preparing the ink for forming the positive hole injection transport layer containing the molybdenum complex or tungsten complex, and the organic solvent having a carbonyl group and/or hydroxyl group; the forming step of forming the positive hole injection transport layer containing the molybdenum complex or tungsten complex on any of layers on electrodes; and the oxidation step of oxidizing at least the molybdenum complex or tungsten complex in the positive hole injection transport layer to produce the molybdenum oxide or tungsten oxide, can be exemplified. By using the above method, the positive hole injection transport layer containing the reaction product of the molybdenum complex or tungsten complex can be formed. The oxidation step may be performed after applying the ink for forming the positive hole injection transport layer in a form of layer on any of layers on the electrodes while drying the organic solvent in the layer containing the molybdenum complex or tungsten complex and the above organic solvent.

It is preferable that the molybdenum oxide or tungsten oxide obtained in the oxidation step is the composite of molybdenum having an oxidation number of +5 and molybdenum having an oxidation number of +6, or the composite of tungsten having an oxidation number of +5 and tungsten having an oxidation number of +6. In addition, it is preferable that the composite of molybdenum having an oxidation number of +5 and molybdenum having an oxidation number of +6, or the composite of tungsten having an oxidation number of +5 and tungsten having an oxidation number of +6 is the reaction product of the molybdenum complex or tungsten complex with the organic solvent having the carbonyl group and/or hydroxyl group.

As another embodiment of the method for producing the device of the present invention, a method comprising: the oxidation step being performed after the preparation step of preparing the ink for forming the positive hole injection transport layer, before the step of forming the positive hole injection transport layer; and the formation step of forming the positive hole injection transport layer containing the molybdenum oxide or tungsten oxide on any of layers on the electrode using the oxidized ink for forming the positive hole injection transport layer containing the molybdenum oxide or tungsten oxide, can be exemplified.

By using the above method, the positive hole injection transport layer containing the reaction product of the molybdenum complex or tungsten complex can be formed. After the layer is formed, another oxidation step may be further performed.

The oxidized ink for forming the positive hole injection transport layer can be obtained by performing a redox reaction between the molybdenum complex or tungsten complex and the organic solvent having the carbonyl group and/or hydroxyl group.

As the ink for forming the positive hole injection transport layer in the above case, it is preferable to contain the composite of molybdenum having an oxidation number of +5 and molybdenum having an oxidation number of +6 being the reaction product of the molybdenum complex, or the composite of tungsten having an oxidation number of +5 and tungsten having an oxidation number of +6 being the reaction product of the tungsten complex, and the organic solvent having the carbonyl group and/or hydroxyl group, from the viewpoint of lowering driving voltage and extending the element lifetime.

Examples of means of oxidizing the molybdenum complex or tungsten complex include a heating process, a light irradiation process, and a process of using active oxygen, and they may be appropriately used in a combination. Since oxidation is efficiently performed in the oxidation step, the oxidation step is preferably performed in the presence of oxygen.

In the case of using the heating process, examples of heating means include a heating method on a hot plate and a heating method in an oven. The heating temperature is preferably from 50 to 250° C. The heating temperature makes a difference in the reactivity of the molybdenum complex or tungsten complex, the interaction between the molybdenum or tungsten complexes, and the interaction for the positive hole transport compound of the molybdenum complex or tungsten complex, therefore, it is preferable that the heating temperature is appropriately adjusted.

In the case of using the light irradiation process, examples of light irradiation means include a method for exposing ultraviolet, etc. The amount of light irradiation makes a difference in the reactivity of the molybdenum complex or tungsten complex, the interaction between the molybdenum or tungsten complexes, and the interaction for the positive hole transport compound of the molybdenum complex or tungsten complex, therefore, it is preferable that the amount of irradiation is appropriately adjusted.

In the case of using the process of using active oxygen, examples of means of using active oxygen include a method for using active oxygen generated by ultraviolet, and a method for using active oxygen generated by exposing a photocatalyst such as a titanium oxide to ultraviolet. The amount of active oxygen makes a difference in the reactivity of the molybdenum complex or tungsten complex, the interaction for the positive hole transport compound of the molybdenum complex or tungsten complex, and the interaction between the molybdenum or tungsten complexes, therefore, it is preferable that the amount of active oxygen is appropriately adjusted.

As for other processes in the method for producing the device, a known process can be appropriately used.

EXAMPLES

Hereinafter, the present invention will be explained further in detail with reference to examples.

The scope of the present invention is not limited to the following examples. Herein, in the examples, "part(s)" represents "parts by weight" if not particularly mentioned.

Synthesis example 1

Molybdenum complex 1 described in the formula below was synthesized as the scheme described below in accordance with the method described in "Inorganic Chemistry, 13, 1974, p. 1,824". It was confirmed that the synthesized Molybdenum complex 1 had the following structure by measuring $^1$H NMR spectrum by means of a nuclear magnetic resonance spectrum (product name: JNM-LA400WB; manufactured by JEOL Ltd.).

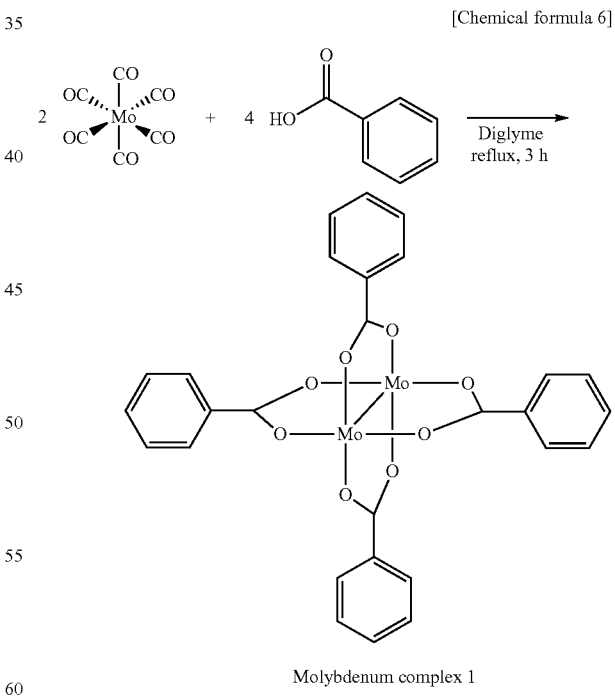

Molybdenum complex 1

Synthesis example 2

An ink for forming a positive hole injection transport layer containing a reaction product of a molybdenum complex was prepared.

Molybdenum hexacarbonyl was dissolved in cyclohexanone and the resultant solution was heated at 100° C. for 10 minutes in the air, thus, the ink for forming the positive hole injection transport layer was prepared. Next, a solvent component of the ink was distilled under reduced pressure with a diaphragm pump.

The remaining black dispersion was further heated to 150° C. using an oil bath under reduced pressure with a rotary pump to obtain a high-boiling distillate (reaction product of molybdenum complex: organic-inorganic composite oxide containing molybdenum).

[Measurement of Oxidation Number of Reaction Product of Molybdenum Complex]

In order to examine the presence of molybdenum having an oxidation number of +5 in the reaction product of the molybdenum complex obtained in Synthesis example 2, spectra of eight samples were compared by an infrared spectroscopy. FT-IR (product name: FTS6000; manufactured by VARIAN, Inc.) was used for the infrared spectroscopic measurement.

Sample 1: molybdenum hexacarbonyl powder

Sample 2: high-boiling distillate (reaction product of molybdenum complex) obtained in Synthesis example 2

Sample 3: The ink for forming the positive hole injection transport layer obtained in Synthesis example 2 was applied on a glass substrate by a spin coating method to form a thin film (film thickness: 50 nm). The thin film was dried in the air at room temperature (22° C.), and thus dried thin film was grated using a cutter to obtain powder for Sample 3.

Sample 4: The ink for forming the positive hole injection transport layer obtained in Synthesis example 2 was applied on a glass substrate by a spin coating method to form a thin film (film thickness: 50 nm). After heating the thin film for 30 minutes in the air at 200° C., thus obtained thin film was grated using a cutter to obtain powder for Sample 4.

Sample 5: Molybdenum hexacarbonyl was dissolved in cyclohexanone and the resultant solution was heated at 100° C. for 10 minutes in a glove box (oxygen concentration: 0.1 ppm or less; water concentration: 0.1 ppm or less) to prepare an ink for forming a positive hole injection transport layer. In the glove box, the ink was applied on a glass substrate by a spin coating method to form a thin film (film thickness: 50 nm). After heating the thin film at 200° C. for 30 minutes in the glove box, thus obtained film was grated using a cutter to obtain powder for Sample 5.

Sample 6: $MoO_3$ (manufactured by KOCH CHEMICALS LTD.) powder

Sample 7: $MoO_3$ film (100 nm) formed on a glass substrate by depositing $MoO_3$ under vacuum condition by a resistance heating method was grated using a cutter to obtain powder for Sample 7.

Sample 8: $MoO_3$ film (100 nm) formed on a glass substrate by depositing NPD (bis(N-(1-naphthyl-N-phenyl)benzidine)) and $MoO_3$ under vacuum condition by a resistance heating method so that a volume ratio of NPD (bis(N-(1-naphthyl-N-phenyl)benzidine)) and $MoO_3$ is 9:1 was grated using a cutter to obtain powder for Sample 8.

Figure 7:
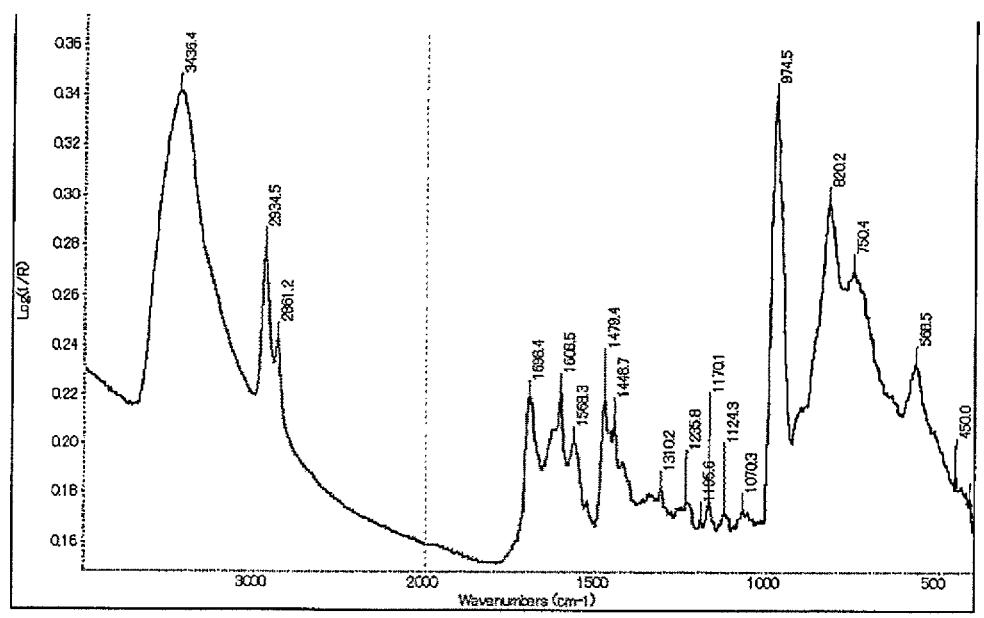
FIG. 7 is a view showing a result of IR measurement of the reaction product of the molybdenum complex obtained in Synthesis example 2.

The measurement results of Samples 1 to 8 are shown in Table 1. IR spectrum of Sample 2 is shown in FIG. 7.

Symbols in Table 1 represent intensity of spectrum.
◉: : having strong absorption
○: having not strong absorption
Δ: having weak absorption
x: having no absorption
unknown: beyond recognition due to overlapping with peaks of other components

TABLE 1

Results of IR measurement

| | | IR (cm−1) | | | | |
|---|---|---|---|---|---|---|
| | | 1620 | 975 | 910 | 750 | 560 |
| Sample 1 | Mo complex | X | X | X | X | X |
| Sample 2 | Ink distillate | ○ | ◉ | ○ | ○ | ○ |
| Sample 3 | Film of composite oxide | ○ | ◉ | ○ | ○ | ○ |
| Sample 4 | Film of composite oxide after heating | ○ | ◉ | ○ | ○ | ○ |
| Sample 5 | In glove box | X | X | X | X | X |
| Sample 6 | Inorganic compound powder | X | X | X | X | X |
| Sample 7 | Vapor-deposited film of inorganic compound | ○ | Δ | ○ | ○ | ○ |
| Sample 8 | Codeposited film of NPD and inorganic compound | ○ | Δ | ○ | unknown | ○ |

(Measurement Result)

It was studied if the above eight samples had absorption in five absorption wave numbers (1620, 975, 910, 750 and 560 cm$^{-1}$), which are said to be related to the transition of Mo having an oxidation number of +5 and Mo having an oxidation number of +6 ("Synthetic Metals", (1997), vol. 85, p. 1,229 to 1,232). In Sample 1 (Mo complex powder) and Sample 5 (sample prepared in an atmosphere of glove box without having oxygen), the peaks attributed to the absorption of Mo having an oxidation number of +5 and Mo having an oxidation number of +6 were not observed. On the other hand, in Samples 2, 3 and 4, characteristic peaks of Mo having an oxidation number of +5 and Mo having an oxidation number of +6 were observed. This result shows that a Mo oxide was formed in the ink upon producing the ink in the air, the coexisting state of Mo having an oxidation number of +5 and Mo having an oxidation number of +6 was realized, the state was kept even in the thin film, and the state was stably kept even after drying at 200° C. In contrast, while the presence of Mo having an oxidation number of +5 was not confirmed in Sample 6 ($MoO_3$ powder of inorganic compound), the presence of Mo having an oxidation number of +5 was confirmed in Samples 7 and 8, in which $MoO_3$ of the inorganic compound was deposited. This is considered because the bond was broken by energy generated by deposition and then the film was formed in the condition of oxygen defect, therefore, Mo having an oxidation number of +5 was present. Although a composite of Mo having an oxidation number of +5 and Mo having an oxidation number of +6 (Sample 2) synthesized from the Mo complex was soluble in an organic solvent such as cyclohexanone, etc., Samples 7 and 8 were insoluble in the organic solvent. Therefore, as the compound, the composite of Mo having an oxidation number of +5 and Mo having an oxidation number of +6 synthesized from the Mo complex was obviously different from the composite obtained by the deposition of the inorganic compound. Further, in Samples 2, 3 and 4 containing the composite of Mo having an oxidation number of +5 and Mo having an oxidation number of +6 synthesized from the Mo complex, the strong peak typified by 975 cm$^{-1}$ was confirmed, therefore, it is assumed that the element lifetime was significantly extended in the present invention due to the above differences. In addition, in the IR measurement of Sample 4, although heating was performed at 200° C. upon forming the thin film, the peak derived from cyclohexanone (boiling temperature at 151° C.) being the solvent was strongly observed, thus, it is presumed that while the Mo complex was oxidized in the solvent, the Mo complex formed an anion cluster of Mo having an oxidation number of +5 and Mo having an oxidation number of +6. The cyclohexanone was reductively polymerized and altered at the same time as generating the anion cluster of Mo, thereby, it is assumed that the Mo anion cluster and polymerized alteration product of cyclohexanone were strongly interacted each other such as forming a chemical bond, and then the reaction product of the Mo complex was soluble in the solvent. In the above Sample 2, the polymerized alteration product of cyclohexanone was obtained as a high-boiling distillate, which also supports estimated production mechanism of the Mo cluster anion.

[Measurement of Ratio of Oxidation Numbers of +5 and +6 Of Reaction Product of Molybdenum Complex]

Figure 8:
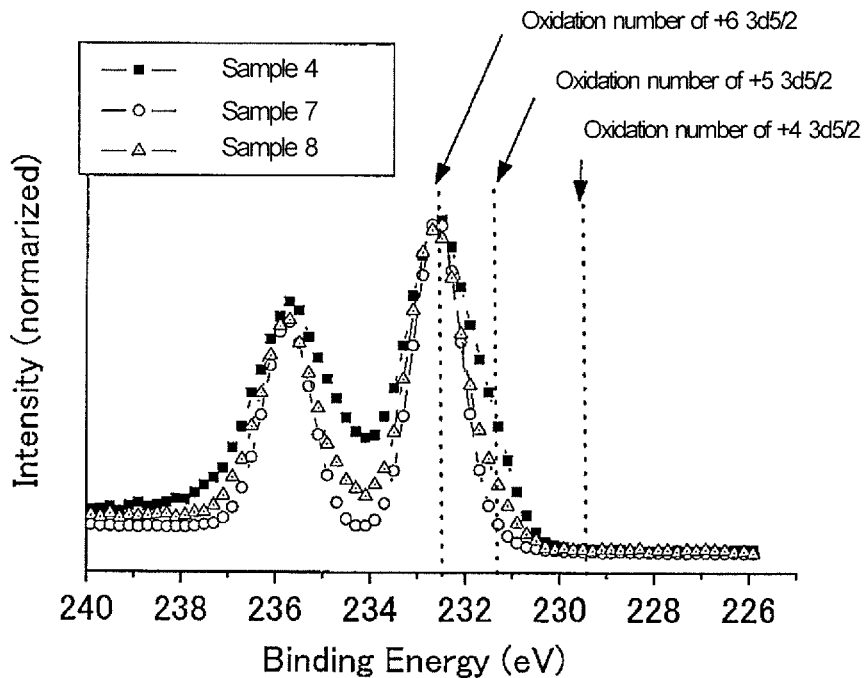
FIG. 8 is a magnified view of a part of XPS spectra of Samples 4, 7 and 8.

In order to examine a ratio of molybdenum having an oxidation number of +5 and molybdenum having an oxidation number of +6 in the reaction product (organic-inorganic composite oxide) of the molybdenum complex, spectra of three samples (Samples 4, 7 and 8 described above) were compared by XPS (X-ray photoelectron spectroscopy). The measurement was performed under the following conditions by means of X-ray Photoelectron Spectroscopy measurement apparatus (product name: Theta-Probe; manufactured by Thermo Fisher Scientific K.K.); X-ray source: Monochromated Al Kα (monochromatic X-ray); X-ray irradiation range (=measurement range): 400 μmϕ; X-ray output: 100 W; lens mode: Standard; intake angle of photoelectron: 53° (in the case that normal of sample is 0°; charge neutralizing: an electron neutralizing gun (+6V, 0.05 mA); low energy $Ar^+$ ion irradiation. The measurement results are shown in Table 2. Table 2 shows peak intensity of Mo having an oxidation number of +5 in the case that peak separation was performed with respect to peaks of Mo having an oxidation number of +6 and Mo having an oxidation number of +5, and Mo having an oxidation number of +6 was standardized as 100. XPS spectra of Samples 4, 7 and 8 are shown in FIG. 8.

TABLE 2

Results of XPS measurement

|  | Mo having an oxidation number of +5 3 d 5/2 232.5 eV | Mo having an oxidation number of +6 3 d 5/2 231.2 eV |
|---|---|---|
| Sample 4 | 10 | 100 |
| Sample 7 | 0 | 100 |
| Sample 8 | 5 | 100 |

(Measurement Result)

In the spectrum of the reaction product (Sample 4) of the molybdenum complex, the component of molybdenum having an oxidation number of +5 was observed in the form of shoulder compared to a $MoO_3$ vapor-deposited film (Sample 7). The ratio of molybdenum having an oxidation number of +5 in the reaction product (Sample 4) of the molybdenum complex was twice as high as that in the case of codeposition of NPD and the inorganic compound (Sample 8). In the $MoO_3$ deposited film of Sample 7, molybdenum having an oxidation number of +5 was below detection limit. Particularly, molybdenum in the reaction product of the molybdenum complex of the present invention is characterized in that the state of molybdenum having an oxidation number of +5, which is generally unstable, is stably remained either in the air or in the heating process. In contrast, it is presumed that molybdenum having an oxidation number of +5 was present in the codeposited film (Sample 8) of NPD and the inorganic compound by weak interaction caused by formation of a charge transfer complex, and if NPD was removed, the oxidation number of +5 disappeared. In addition, the deposited film of NPD and the inorganic compound was also insoluble in the solvent. It is assumed that significant extension of the element lifetime using the positive hole injection transport layer of the present invention is attributed to the differences of stability, strength of interaction, and the ratio of the molybdenum having an oxidation number of +5.

The reaction product of the molybdenum complex of the present invention is a reaction product, which can be considered as an organic-inorganic composite, formed by oxidizing molybdenum having low oxidation number (0, +2, etc.), and reducing cyclohexanone being the organic solvent. In contrast, it is presumed that, in the case of the codeposited film of NPD and $MoO_3$, the charge transfer complex, which interacts weakly, is formed by oxidizing amine of NPD, and reducing $MoO_3$. Thus, it is also presumed that the differences in the amount of molybdenum having an oxidation number of +5 and the element lifetime thereof are attributed to opposite reaction path of redox in which molybdenum having an oxidation number of +5 is produced.

[Measurement of Particle Diameter by Particle Size Distribution Analyzer]

The particle diameter of the reaction product of the molybdenum complex was measured by a dynamic light scattering method. The measurement was performed by means of a dynamic light scattering measurement apparatus (product name: Nanotrac Particle size analyzer UPA-EX150; manufactured by NIKKISO CO., LTD.).

The measurement was performed after filtering the ink for forming the positive hole injection transport layer obtained in Synthesis example 2 using a filter of 0.2 μm.

Figure 9:
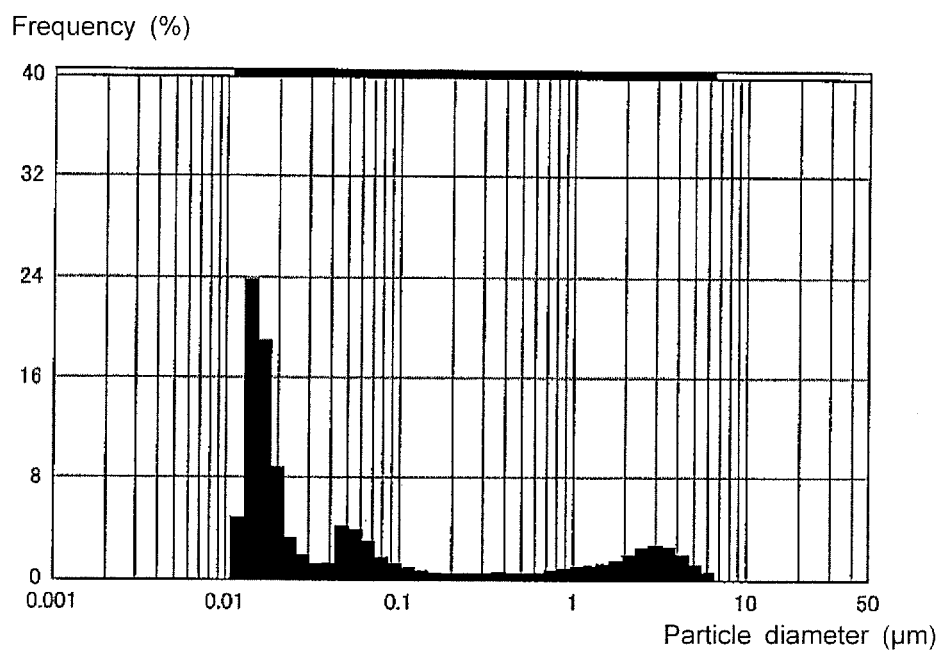
FIG. 9 is a view showing a result of particle diameter measurement by means of a particle size distribution analyzer of the reaction product of the molybdenum complex obtained in Synthesis example 2.

Accordingly, MV (Mean Volume Diameter) was 15 nm, and MN (Mean Number Diameter) was 6.2 nm. The measurement result is shown in FIG. 9.

[Observation of Anion State]

The ion state of molybdenum was measured using Samples 4, 5, 6 and 7 described above by means of MALDI-TOF-MS. The measurement was performed in a negative mode by means of MALDI-TOF-MS (product name: REFLEX II; manufactured by Bruker Japan Co., Ltd.).

Figure 10:
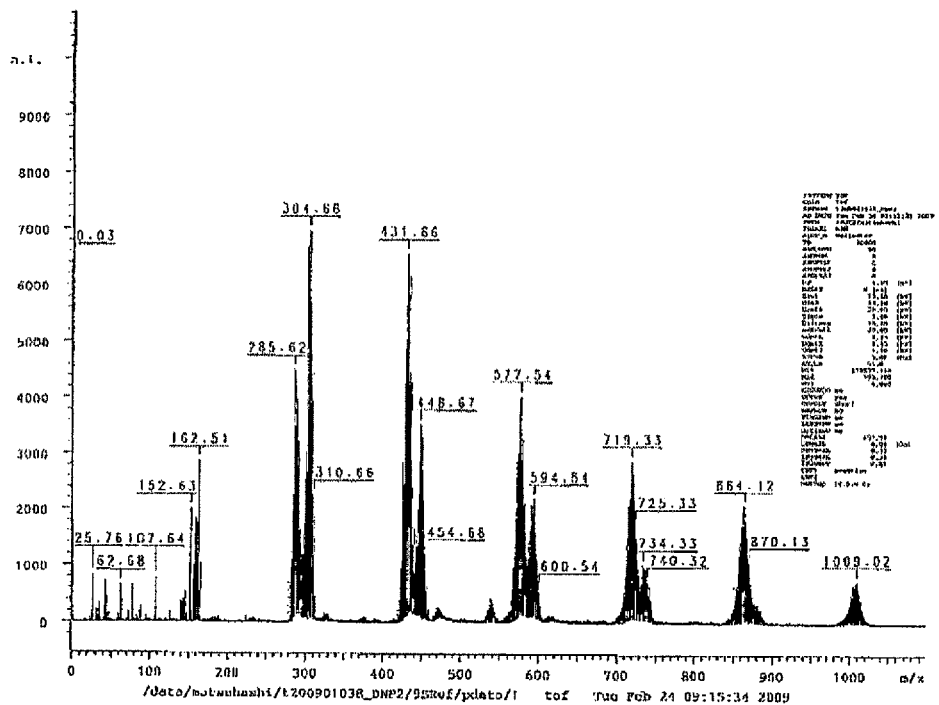
FIG. 10 is a view showing MALDI-TOF-MS spectrum of the reaction product of the molybdenum complex.

In Sample 4 corresponding to the present invention, the reaction product of the molybdenum complex was detected as anion. This result agrees with the measurement results of IR and XPS. Furthermore, the spectrum which suggests the formation of a cluster was obtained from Sample 4 (FIG. 10).

On the other hand, in Sample 5 in which the sample was obtained in the glove box, anion was not detected. This result agrees with the measurement results of IR and XPS.

In Samples 6 and 7 using the inorganic compound, molybdenum was detected as anion, however, the peak having m/z of 600 or more, which suggests that molybdenum is an anion cluster, was not detected (Sample 6: m/z=287.70, 431.75; Sample 7: 285.67, 233.73). This result agrees with the measurement results of IR and XPS.

From the above results, it is presumed that, in Sample 4, the reaction product of the molybdenum complex forms an anion cluster as an organic-inorganic composite oxide.

[Measurement of Cyclohexanone by NMR]

Figure 11:
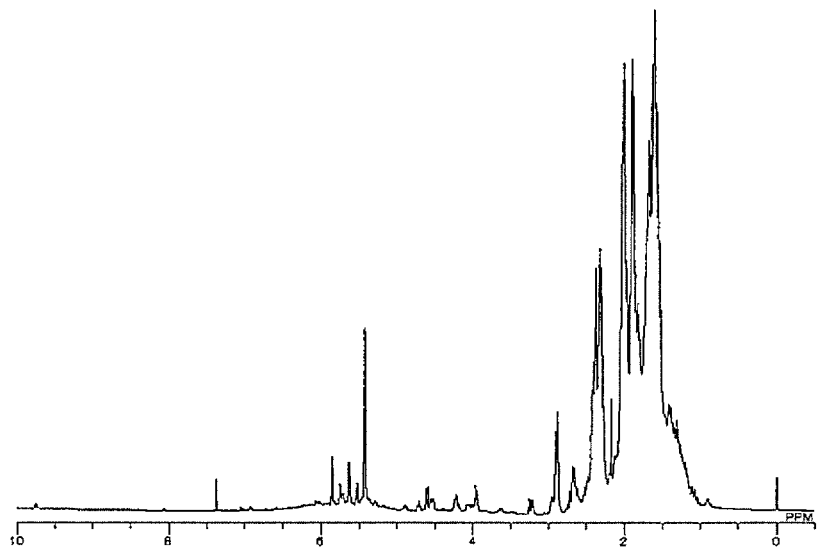
FIG. 11 is a view showing NMR spectrum of the reaction product of the molybdenum complex.

In order to examine the state of cyclohexanone observed by the IR measurement, $^1$H-NMR measurement and $^{13}$C-NMR measurement were performed. The measurement was performed by means of a nuclear magnetic resonance apparatus (product name: JNU-LA400 W; manufactured by JEOL Ltd.; 400 MHz) by dissolving powder for Sample 4 in deuterated chloroform in a concentration of 0.5 weight %. $^1$H-NMR spectrum of Sample 4 is shown in FIG. 11. The NMR measurements of molybdenum hexacarbonyl being a material of the molybdenum complex and cyclohexanone being an organic solvent were performed similarly as in the above measurement.

Spectra of Sample 4, molybdenum hexacarbonyl being the raw material of the molybdenum complex, and cyclohexanone being the organic solvent were respectively compared.

It was confirmed that, from the chart obtained in the $^{13}$C-NMR measurement of Sample 4, the spectrum indicating molybdenum hexacarbonyl disappeared. This result agrees with the result indicating that Mo was altered to an oxide in the XPS spectrum of Sample 4. Furthermore, in the spectrum of the $^1$H-NMR spectrum of Sample 4, the spectrum, which suggests that alcohol, an oligomer or a polymer was formed by reducing a C=O bond of cyclohexanone, was obtained in the spectrum derived from cyclohexanone used as the solvent. It is assumed that the anion cluster of molybdenum and the polymerized alternation product of cyclohexanone were simultaneously produced from the above redox reaction, strongly interacted each other such as forming a chemical bond so that they can be soluble in a solvent, and the oxidation states of the Mo anion cluster having an oxidation number of +5 and Mo anion cluster having an oxidation number of +6 were stabilized.

Example 1

On a glass substrate, a transparent anode, a laminate of a layer containing a molybdenum complex and a layer containing a positive hole transport compound as a positive hole injection transport layer, a positive hole transport layer, a light emitting layer, an electron injection layer, and a cathode were formed as layers in this order and laminated. Then, sealing was finally performed to produce an organic EL element.

The layers except the transparent anode and the positive hole injection transport layer were formed in a nitrogen purged glove box with water concentration of 0.1 ppm or less and oxygen concentration of 0.1 ppm or less.

Firstly, a thin film (thickness: 150 nm) of Indium Tin Oxide (ITO) was used as the transparent anode. A glass substrate with ITO (manufactured by Sanyo vacuum industries Co., Ltd.) was subjected to patterning in the form of stripe. The ITO substrate subjected to patterning was subjected to ultrasonic cleaning using a neutral detergent and ultrapure water in this order followed by UV-ozonation. HOMO of ITO after performing UV-ozonation was 5.0 eV.

Next, Molybdenum complex 1 obtained in the above synthesis was dissolved in ethyl benzoate in a concentration of 0.4 weight % to prepare a coating solution for forming a positive hole injection transport layer (1).

Then, the coating solution for forming the positive hole injection transport layer (1) was applied on a cleaned anode by a spin coating method to form a positive hole injection transport layer containing the molybdenum complex. After applying the coating solution for forming the positive hole injection transport layer (1), the positive hole injection transport layer was dried at 200° C. for 30 minutes using a hot plate to evaporate the solvent. The thickness of the positive hole injection transport layer (1) after drying was 5 nm or less.

Next, on thus produced positive hole injection transport layer (1), a thin film (thickness: 10 nm) of poly[(9,9-dioctylfluorenyl-2,7-diyl)-co-(4,4'-(N-(4-sec-butylphenyl)) diphenylamine)] (TFB) being a conjugated polymer material was formed as a positive hole injection transport layer (2). It was formed by applying a solution in which TFB was dissolved in xylene in a concentration of 0.4 weight % by a spin coating method. After applying the TFB solution, the positive hole injection transport layer (2) was dried at 200° C. for 30 minutes using a hot plate to evaporate the solvent.

Then, on thus formed positive hole injection transport layer (2), a thin film (thickness: 100 nm) of bis(N-(1-naphthyl-N-phenyl)benzidine) (α-NPD) was formed as the positive hole transport layer. Further, on the positive hole transport layer, a thin film (thickness: 60 nm) of tris(8-hydroxyquinolinato) aluminum complex (Alq$_3$) was formed as the light emitting layer. The positive hole transport layer and the light emitting layer were formed under vacuum condition (pressure: $1 \times 10^{-4}$ Pa) by a resistance heating vapor deposition method.

Next, on thus produced light emitting layer, a film (thickness: 0.5 nm) of lithium fluoride (LiF) as the electron injection layer and a film (thickness: 100 nm) of Al as the cathode were sequentially formed under vacuum condition (pressure: $1 \times 10^{-4}$ Pa) by a resistance heating vapor deposition method.

Finally, after forming the cathode, the above layers were sealed in the glove box using alkali-free glass and a UV curable epoxy bonding agent, thus, the organic EL element of Example 1 was produced.

Example 2

An organic EL element of Example 2 was produced similarly as in Example 1 except that only a layer (one layer) in which TFB and Molybdenum complex 1 were mixed at the weight ratio of 2:1 was formed as the positive hole injection transport layer instead of the positive hole injection transport layer of Example 1, and the positive hole injection transport layer (2) was not formed.

The positive hole injection transport layer was formed by preparing a coating solution for forming the positive hole injection transport layer in which TFB and Molybdenum complex 1 were dissolved in ethyl benzoate at the weight ratio of 2:1 in a concentration of 0.4 weight %, and applying the coating solution for forming the positive hole injection transport layer on the cleaned anode by a spin coating method. After applying the coating solution for forming the positive hole injection transport layer, the positive hole injection transport layer was dried at 200° C. for 30 minutes using a hot plate to evaporate the solvent. The thickness of the positive hole injection transport layer after drying was 10 nm.

Example 3

An organic EL element of Example 3 was produced similarly as in Example 2 except that the positive hole injection transport layer was dried at 100° C. for 30 minutes instead of drying at 200° C. for 30 minutes.

Example 4

An organic EL element of Example 4 was produced similarly as in Example 1 except that the layer in which, instead of TFB, TFB and Molybdenum complex 1 were mixed at the weight ratio of 2:1 was used as the positive hole injection transport layer (2).

The positive hole injection transport layer (2) was formed by preparing the coating solution for forming the positive hole injection transport layer (2) in which TFB and Molybdenum complex 1 were dissolved in ethyl benzoate at the weight ratio of 2:1 in a concentration of 0.4 weight %, and applying the coating solution for forming the positive hole injection transport layer (2) on the formed positive hole injection transport layer (1) by a spin coating method.

After applying the coating solution for forming the positive hole injection transport layer (2), the positive hole injection transport layer (2) was dried at 200° C. for 30 minutes using a hot plate to evaporate the solvent. The thickness of the positive hole injection transport layer (2) after drying was 10 nm.

Comparative example 1

An organic EL element of Comparative example 1 was produced similarly as in Example 2 except that a thin film (thickness: 10 nm) of TFB was used as the positive hole injection transport layer.

Comparative example 2

An organic EL element of Comparative example 2 was produced similarly as in Comparative example 1 except that a thin film (thickness: 1 nm) of a molybdenum oxide ($MoO_3$) was formed instead of forming the thin film of TFB as the positive hole injection transport layer.

The thin film of $MoO_3$ was formed under vacuum condition (pressure: $1 \times 10^{-4}$ Pa) by a resistance heating vapor deposition method.

<Measurement of HOMO (Work Function)>

HOMO (work function) of the thin film formed of the molybdenum complex obtained in Synthesis example 1 similarly as in Example 1 and the thin film of the molybdenum oxide ($MoO_3$) used in Comparative example 2 was measured by means of a Photoelectron Spectroscopy measurement apparatus (product name: AC-1; manufactured by RIKEN KEIKI Co., Ltd.).

A thin film was formed by dissolving the molybdenum complex obtained in Synthesis example 1 in ethyl benzoate to prepare an ink, and applying the ink on a cleaned glass substrate with ITO (manufactured by Sanyo vacuum industries Co., Ltd.) by a spin coating method. Thus formed thin film was heated at 200° C. for 30 minutes in the air to form a thin film of the reaction product of the molybdenum complex having a thickness of 40 nm after drying.

In addition, $MoO_3$ was deposited on a cleaned glass substrate with ITO (manufactured by Sanyo vacuum industries Co., Ltd.) under vacuum condition by a resistance heating method to form a $MoO_3$ film (40 nm).

The energy value of emitted photoelectron was determined by means of the Photoelectron Spectroscopy measurement apparatus (product name: AC-1). The reaction product of the molybdenum complex was measured under the condition of 50 nW light intensity, and $MoO_3$ was measured under the condition of 200 nW light intensity, respectively at 0.05 eV intervals.

Accordingly, the work function of the thin film formed of the molybdenum complex of Synthesis example 1 was 5.04 eV, and the work function of the thin film of the molybdenum oxide ($MoO_3$) was 5.63 eV. The measurement result of $MoO_3$ almost agrees with the value in the document within ±0.05 eV accuracy. The ionization potential of the reaction product of the molybdenum complex is smaller than that of $MoO_3$ since the reacted organic substance may be interacted or ionization potential of the organic substance in the reaction product may be reflected.

The organic EL elements produced in the above Examples and Comparative examples emitted green light derived from $Alq_3$, and were evaluated for their applied voltage upon driving at 10 mA/cm² and lifetime property by the following methods. The results are shown in Table 3.

The lifetime property of the organic EL element was evaluated by observing luminance which was gradually decreasing over time in a constant current driving. Herein, time (hr.) until the retention of luminance decreases to 80% with respect to the initial luminance of 5,000 cd/m² was determined as a lifetime (LT 80).

TABLE 3

| | Positive hole injection transport layer | 10 mA/cm² upon driving Applied voltage (V) | Elapsed time at retention of 80% in a constant current driving initiated at initial luminance of 5,000 cd/m² (hr.) LT 80 |
|---|---|---|---|
| Example 1 | Laminate of Mo complex 1 (<5 nm)/ TFB (10 nm) | 9.8 | 70 |
| Example 2 | TFB:Mo complex 1 = 2:1 (10 nm) (drying at 200° C.) | 5.6 | 100 |
| Example 3 | TFB:Mo complex 1 = 2:1 (10 nm) (drying at 100° C.) | 5.3 | 80 |
| Example 4 | Laminate of Mo complex 1 (<5 nm)/ TFB:Mo complex 1 = 2:1 (10 nm) | 5.4 | 100 |
| Comparative example 1 | TFB (10 nm) | 16.5 | 0.3 |
| Comparative example 2 | $MoO_3$ (1 nm) | 5.1 | 13 |

<Results>

Comparing Comparative example 1 with Example 1, driving voltage was lower and lifetime property LT 80 was longer in Example 1 in which Molybdenum complex 1 and TFB were laminated than those in Comparative example 1 in which only TFB was used for the positive hole injection transport layer. The reasons thereof are assumed that the reaction product of Molybdenum complex 1 and TFB interacted at the interface of layers, thus, the charge injection property to TFB and the stability of charge transport of TFB improved, and further, the reaction product of Molybdenum complex 1 was an organic-inorganic composite so that the affinity between the electrode (ITO) and the positive hole transport layer (TFB) increased, thus, the stability of adhesion of the interface between layers improved.

Furthermore, comparing Comparative example 1 with Example 2 and Example 3, driving voltage was lower and lifetime property LT 80 was longer in Example 2 and Example 3 in which Molybdenum complex 1 was mixed in TFB than that in Comparative example 1. The reason is assumed that Molybdenum complex 1 and TFB were mixed so that they were easily interacted, thus, charge injection property and the stability of charge transport further improved. Drying temperature made a difference in properties of Examples 2 and 3, therefore, it is considered that heating temperature makes a difference in the reaction state of the molybdenum complex, the interaction to the positive hole transport compound of the reaction product of the molybdenum complex, and the interaction between the reaction products of the molybdenum complex.

That is, it is expected that lifetime property LT 80 is longer at drying of 200° C. than that at drying at 100° C. because the reactivity of the molybdenum complex becomes excellent, the interaction between the reaction product of the molybdenum complex and TFB and the interaction between the reaction products of the molybdenum complex are strong at drying of 200° C., and the interaction by heating is weaker at drying of 100° C. than that of drying of 200° C. In addition, the driving voltage also decreased from 5.6 V to 5.3 V, thereby, it is presumed that there is a difference in the interaction with ITO being a substrate similarly as the above.

The positive hole injection transport layer of Example 4 is a laminate of the layer of Molybdenum complex 1 and the mixed layer of TFB and Molybdenum complex 1 (combination of Example 1 and Example 2), the layer using the molybdenum complex was inserted between the electrode (ITO) and the mixed layer, thereby, the driving voltage further lowered. The reason thereof is assumed that the reaction product of Molybdenum complex 1 was an organic-inorganic composite at the interface of the electrode (ITO) and the mixed layer so that the affinity between ITO and TFB increased, thereby, the stability of adhesion of the interface improved.

The lifetime property LT 80 of Examples 1 to 4 were longer than that of Comparative example 2 using $MoO_3$. The reason thereof is assumed that the adhesion of the interface between the electrode (ITO) and the positive hole transport layer "a" (TFB) was higher in the case of using the molybdenum complex containing metal and a ligand than that in the case of using $MoO_3$ being an inorganic substance.

Example 5

On a glass substrate with a transparent anode, a laminate of a layer containing the reaction product of the Mo complex (positive hole injection layer) and a layer containing the positive hole transport compound (positive hole transport layer) as the positive hole injection transport layer, a light emitting layer, a positive hole block layer, an electron transport layer, an electron injection layer, and a cathode were formed as layers in this order and laminated. Then, sealing was finally performed to produce an organic EL element.

Firstly, a thin film (thickness: 150 nm) of Indium Tin Oxide (ITO) was used as the transparent anode. A glass substrate with ITO (manufactured by Sanyo vacuum industries Co., Ltd.) was subjected to patterning in the form of stripe. The ITO substrate subjected to patterning was subjected to ultrasonic cleaning using a neutral detergent and ultrapure water in this order followed by UV-oxonation.

Next, molybdenum hexacarbonyl was dissolved in cyclohexanone in a concentration of 0.5 wt %, and heated at 100° C. for 10 minutes in the air to produce an ink for forming the positive hole injection transport layer (1). Then, a positive hole injection transport layer was formed by applying the ink by a spin coating method so that the thickness of the layer after drying was 10 nm. After applying the positive hole injection transport layer, the layer was dried at 200° C. for 30 minutes using a hot plate to evaporate the solvent in the thin film. All of the above applying formation and drying process of the positive hole injection transport layer were performed in the air.

Next, on thus produced positive hole injection transport layer, a thin film (thickness: 30 nm) of TFB being a conjugated polymer material was formed as the positive hole injection transport layer (2). It was formed by applying the solution in which TFB was dissolved in xylene in a concentration of 0.7 weight % by a spin coating method. After applying the solution of TFB, the positive hole injection transport layer (2) was dried at 200° C. for 30 minutes using a hot plate to evaporate the solvent.

Then, on thus produced positive hole injection transport layer (2), a mixed thin film containing tris(2-phenylpyridine) iridium (III) ($Ir(ppy)_3$) as a luminescent dopant and 4,4'-bis (2,2-carbazole-9-il)biphenyl (CBP) as host was formed by deposition as a light emitting layer. The mixed thin film was formed by codeposition under vacuum condition (pressure: $1 \times 10^{-4}$ Pa) by a resistance heating method so that the volume ratio of the host and the dopant was 20:1, and the total thickness of the film was 40 nm.

Next, on thus produced light emitting layer, a thin film of bis(2-methyl-8-quinolinolato) (p-phenylphenolato)aluminum complex (BAlq) was formed by deposition as a positive hole block layer. The thin film of BAlq was formed under vacuum condition (pressure: $1 \times 10^{-4}$ Pa) by a resistance heating method so that the thickness of the film was 15 nm.

Then, on the positive hole block layer, a thin film of tris(8-hydroxyquinolinato)aluminum complex ($Alq_3$) was formed by deposition under vacuum condition (pressure: $1 \times 10^{-4}$ Pa) by a resistance heating method as an electron transport layer so that the thickness of the film was 15 nm.

Then, on thus produced light emitting layer, a film (thickness: 0.5 nm) of LiF as the electron injection layer and a film (thickness: 100 nm) of Al as the cathode were sequentially formed under vacuum condition (pressure: $1 \times 10^{-4}$ Pa) by a resistance heating vapor deposition method.

Finally, after forming the cathode, the above layers were sealed in the glove box using alkali-free glass and a UV curable epoxy bonding agent, thus, the organic EL element of Example 5 was produced.

Example 6

An organic EL element of Example 6 was produced similarly as in Example 5 except that a molybdenum (II) acetate dimer (manufactured by SIGMA-ALDRICH) was used as the molybdenum complex used for the positive hole injection transport layer (1) instead of molybdenum hexacarbonyl.

Example 7

An organic EL element of Example 7 was produced similarly as in Example 5 except that bis(2,4-pentanedionato) molybdenumdioxide (manufactured by SIGMA-ALDRICH) was used as the molybdenum complex used for the positive hole injection transport layer (1) instead of molybdenum hexacarbonyl.

Example 8

An organic EL element of Example 8 was produced similarly as in Example 5 except that the 1-naphthalene carboxylic acid type molybdenum complex represented by the chemical formula below was used as the molybdenum complex used for the positive hole injection transport layer (1) instead of molybdenum hexacarbonyl.

The 1-naphthalene carboxylic acid type molybdenum complex was synthesized similarly as in Synthesis example 1 except that 4-methyl-1-naphthalene carboxylic acid (manufactured by TOKYO CHENICAL INDUSTRY CO., LTD.) was used instead of benzoic acid.

[Chemical formula 7]

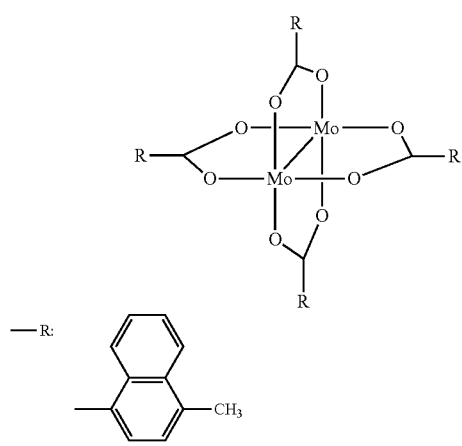

Example 9

An organic EL element of Example 9 was produced similarly as in Example 5 except that the benzoic acid type molybdenum complex of Synthesis example 1 was used as the molybdenum complex used for the positive hole injection transport layer (1) instead of molybdenum hexacarbonyl.

Example 10

An organic EL element of Example 10 was produced similarly as in Example 5 except that the 4-t-butyl benzoic acid type molybdenum complex represented by the chemical formula below was used as the molybdenum complex used for the positive hole injection transport layer (1) instead of molybdenum hexacarbonyl.

The 4-t-butyl benzoic acid type molybdenum complex was synthesized similarly as in Synthesis example 1 except that 4-t-butyl benzoic acid (manufactured by TOKYO CHENICAL INDUSTRY Co., Ltd.) was used instead of benzoic acid.

[Chemical formula 8]

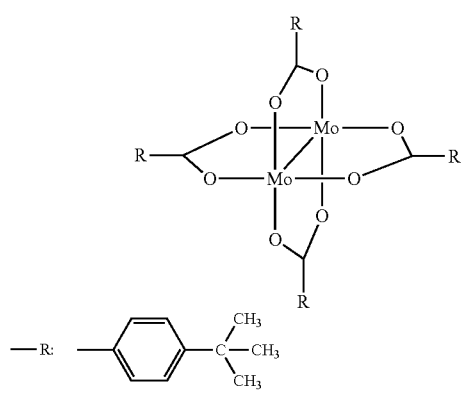

Example 11

An organic EL element of Example 11 was produced similarly as in Example 5 except that the 3,5-dimethyl benzoic acid type molybdenum complex represented by the chemical formula below was used as the molybdenum complex used for the positive hole injection transport layer (1) instead of molybdenum hexacarbonyl.

The 3,5-dimethyl benzoic acid type molybdenum complex was synthesized similarly as in Synthesis example 1 except that 3,5-dimethyl benzoic acid (manufactured by TOKYO CHENICAL INDUSTRY Co., Ltd.) was used instead of benzoic acid.

[Chemical formula 9]

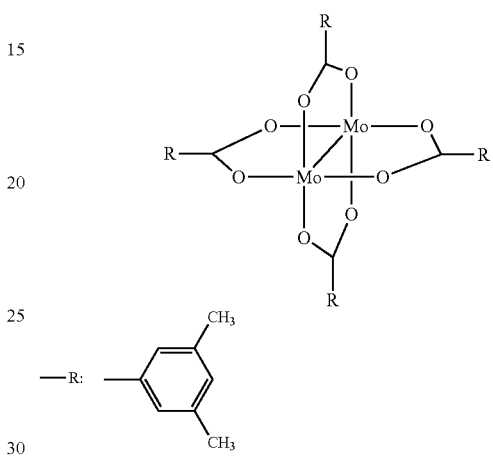

Example 12

An organic EL element of Example 12 was produced similarly as in Example 5 except that the 3,4-dimethyl benzoic acid type molybdenum complex represented by the chemical formula below was used as the molybdenum complex used for the positive hole injection transport layer (1) instead of molybdenum hexacarbonyl.

The 3,4-dimethyl benzoic acid type molybdenum complex was synthesized similarly as in Synthesis example 1 except that 3,5-dimethyl benzoic acid (manufactured by TOKYO CHENICAL INDUSTRY Co., Ltd.) was used instead of benzoic acid.

[Chemical formula 10]

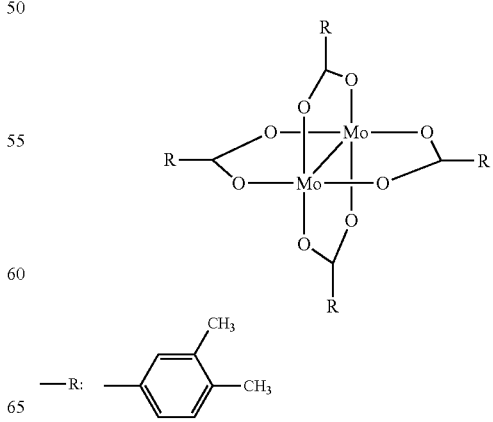

Example 13

An organic EL element of Example 13 was produced similarly as in Example 5 except that ethyl benzoate was used as the solvent in the ink for forming the positive hole injection transport layer (1) instead of cyclohexanone.

Example 14

An organic EL element of Example 14 was produced similarly as in Example 5 except that isopropyl alcohol was used as the solvent in the ink for forming the positive hole injection transport layer (1) instead of cyclohexanone.

Example 15

An organic EL element of Example 15 was produced similarly as in Example 5 except that tungsten hexacarbonyl was used as the complex used for the positive hole injection transport layer (1) instead of molybdenum hexacarbonyl.

Comparative example 3

An organic EL element of Comparative example 3 was produced similarly as in Example 5 except that the positive hole injection transport layer (1) was not produced.

Comparative example 4

An ink for forming the positive hole injection transport layer (1) of Comparative example 4 was prepared similarly as in Example 5 except that toluene was used as the solvent in the ink for forming the positive hole injection transport layer (1) instead of cyclohexanone. However, the molybdenum complex did not dissolve in toluene, the positive hole injection transport layer was not formed, and the reaction product of the molybdenum complex was also not obtained.

Comparative example 5

An organic EL element of Comparative example 5 was produced similarly as in Example 5 except that both the preparation of the ink for forming the positive hole injection transport layer (1) and the formation of the positive hole injection transport layer were performed in the glove box. The molybdenum complex did not react with cyclohexanone, thus, the reaction product of the molybdenum complex was not obtained (see IR measurement result of Sample 5).

All of the organic EL elements produced in the above Examples 5 to 15 and Comparative examples 3 and 5 emitted green light, and were evaluated for their applied voltage upon driving at 10 mA/cm$^2$, electric current efficiency, and lifetime property by the following methods. The results are shown in Table 4.

The electric current efficiency was calculated by the current-voltage-luminance (I-V-L) measurement. The I-V-L measurement was performed by grounding a cathode, applying positive direct voltage to an anode with scanning at 100 mV intervals (1 sec./div.), and recording current and luminance of each voltage. The luminance was measured by means of a luminance meter (product name: BM-8; manufactured by TOPCON CORPORATION). Based on the obtained results, electric current efficiency (cd/A) was calculated from luminous area, the current and the luminance.

The lifetime property of the organic EL element was evaluated by observing luminance which was gradually decreasing over time in a constant current driving. Herein, time (hr.) until the retention of luminance decreases to 80% with respect to the initial luminance of 5,000 cd/m$^2$ was determined as a lifetime (LT 80).

TABLE 4

| | Positive hole injection transport layer | 10 mA/cm$^2$ upon driving Applied voltage (V) | Electric current efficiency (Cd/A) | Elapsed time at retention of 80% in a constant current driving initiated at initial luminance of 5,000 cd/m$^2$ (hr.) LT 80 |
|---|---|---|---|---|
| Example 5 | Mo hexacarbonyl + cyclohexanone | 8.0 | 31 | 38 |
| Example 6 | Mo (II) acetate dimer + cyclohexanone | 8.3 | 30 | 29 |
| Example 7 | Bis(2,4-pentanedionato) Mo dioxide + cyclohexanone | 8.0 | 31 | 32 |
| Example 8 | 1-naphthalene carboxylic acid type Mo complex + cyclohexanone | 7.9 | 29 | 33 |
| Example 9 | Benzoic acid type Mo complex + cyclohexanone | 8.1 | 31 | 35 |
| Example 10 | 4-t-butyl benzoic acid type Mo complex + cyclohexanone | 8.0 | 30 | 28 |
| Example 11 | 3,5-dimethyl benzoic acid type Mo complex + cyclohexanone | 8.1 | 31 | 25 |
| Example 12 | 3,4-dimethyl benzoic acid type Mo complex + cyclohexanone | 8.0 | 31 | 27 |
| Example 13 | Mo hexacarbonyl + ethyl benzoate | 8.3 | 30 | 33 |
| Example 14 | Mo hexacarbonyl + isopropyl alcohol | 8.4 | 29 | 28 |
| Example 15 | Tungsten hexacarbonyl + cyclohexanone | 12.3 | 18 | 5 |
| Comparative example 3 | TFB (10 nm) only | 16.2 | 6 | 0.1 |
| Comparative example 4 | Mo hexacarbonyl + toluene | — | — | — |
| Comparative example 5 | Prepared in glove box | 12 | 10 | 0.1 |

<Results>

It can be understood from the comparison of Examples 5 to 12 with Comparative example 3 that when a molybdenum reaction product produced from various kinds of Mo complexes is used for the positive hole injection transport layer, the voltage of the element lowers, the electric current efficiency becomes high and the lifetime extends. In addition, the voltage of the element, the electric current efficiency and the lifetime are not highly dependent on the types of Mo complex being a starting material.

It can be understood from the comparison of Examples 5, 13 and 14 with Comparative example 4 that when the organic solvent having a C═O bond is used, a Mo complex reacts while dissolving to form the reaction product containing the molybdenum oxide, on the other hand, the reaction does not progress in the case of aromatic toluene.

It can be understood from the comparison of Example 15 with Comparative example 3 that tungsten, which is the same group as molybdenum, forms a reaction product containing a tungsten oxide similarly as molybdenum, thus, element characteristic improves.

It can be understood from the Comparative example 5 that if oxygen is not present, the reaction of the Mo complex hardly progresses, and element characteristic is significantly poor similarly as Comparative example 3.

The invention claimed is:

1. A device comprising a substrate, two or more electrodes facing each other disposed on the substrate and a positive hole injection transport layer disposed between two electrodes among the two or more electrodes,
   wherein the positive hole injection transport layer contains a reaction product of a molybdenum complex or tungsten complex;
   wherein the reaction product of the molybdenum complex is an organic-inorganic composite oxide containing molybdenum and is also a reaction product of a molybdeum complex with an organic solvent having a carbonyl group and/or hydroxyl group; and
   wherein the reaction product of the tungsten complex is an organic-inorganic composite oxide containing tungsten and is also a reaction product of a tungsten complex with an organic solvent having a carbonyl group and/or hydroxyl group.

2. The device according to claim 1, wherein the reaction product of the molybdenum complex or tungsten complex is a composite of molybdenum having an oxidation number of +5 and molybdenum having an oxidation number of +6, or a composite of tungsten having an oxidation number of +5 and tungsten having an oxidation number of +6 respectively.

3. The device according to claim 1, wherein the reaction product of the molybdenum complex or tungsten complex is the composite of molybdenum having the oxidation number of +5 and molybdenum having the oxidation number of +6, or the composite of tungsten having the oxidation number of +5 and tungsten having the oxidation number of +6 respectively, and the reaction product of the molybdenum complex or tungsten complex is in an anion state.

4. The device according to claim 1, wherein the positive hole injection transport layer contains at least the reaction product of the molybdenum complex or tungsten complex, and a positive hole transport compound.

5. The device according to claim 4, wherein the positive hole transport compound is a positive hole transport polymer compound.

6. The device according to claim 1, wherein the positive hole injection transport layer comprises layers in which at least a layer containing the reaction product of the molybdenum complex or tungsten complex, and a layer containing the positive hole transport compound are laminated.

7. The device according to claim 1, wherein the positive hole injection transport layer comprises layers in which at least a layer containing the reaction product of the molybdenum complex or tungsten complex, and a layer at least containing the reaction product of the molybdenum complex or tungsten complex and the positive hole transport compound are laminated.

8. The device according to claim 1, wherein the device is an organic EL element containing an organic layer at least having a light emitting layer.

9. The device according to claim 1, wherein the molybdenum complex is a coordination compound containing molybdenum and a ligand; the tungsten complex is a coordination compound containing tungsten and a ligand; and each ligand contains a carbon atom.

* * * * *